(12) United States Patent
Wolfe et al.

(10) Patent No.: US 11,328,548 B2
(45) Date of Patent: *May 10, 2022

(54) DIAGNOSTIC ELEMENT FOR VALIDATION OF BOLT DETECTION OF A GUARD LOCKING SWITCH IN A STATIC STATE

(71) Applicant: Rockwell Automation Technologies, Inc., Mayfield Heights, OH (US)

(72) Inventors: Timothy P. Wolfe, Medford, MA (US); Yongyao Cai, Acton, MA (US)

(73) Assignee: ROCKWELL AUTOMATION TECHNOLOGIES, INC., Mayfield Heights, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/020,912

(22) Filed: Sep. 15, 2020

(65) Prior Publication Data

US 2020/0410800 A1    Dec. 31, 2020

Related U.S. Application Data

(63) Continuation of application No. 16/427,661, filed on May 31, 2019, now Pat. No. 10,789,798.

(51) Int. Cl.
*G07C 9/28* (2020.01)
*G07C 9/00* (2020.01)
*E05B 47/00* (2006.01)

(52) U.S. Cl.
CPC .......... *G07C 9/28* (2020.01); *G07C 9/00714* (2013.01); *G07C 9/00722* (2013.01); *E05B 2047/0094* (2013.01)

(58) Field of Classification Search
None
See application file for complete search history.

(56) References Cited

U.S. PATENT DOCUMENTS 3,872,696 A * 3/1975 Geringer ............... E05B 47/004
70/145
4,406,999 A * 9/1983 Ward ..................... G01D 5/202
340/870.31

(Continued)

FOREIGN PATENT DOCUMENTS

| DE | 1233922 C2 | 6/1994 |
|---|---|---|
| EP | 0029673 B1 | 1/1985 |
| EP | 2868848 B1 | 1/2017 |

OTHER PUBLICATIONS

European Patent Office, "Communication pursuant to Rule 62 EPC, Extended Search Report", application No. 20177357.9 EPO, dated Nov. 25, 2020, 14 pages.

*Primary Examiner* — John F Mortell

(57) ABSTRACT

A system for sensing a position of a locking bolt of an industrial locking switch includes an inductive circuit, a converter, and a master controller. The inductive circuit includes an inductive coil and a capacitor electrically connected in parallel. The inductive coil is positioned to receive a locking bolt of an industrial locking switch when the locking bolt is transitioned to a lock position. The converter is configured to convert a frequency of a current signal on the inductive circuit to a digital frequency value. The master controller is configured to generate a bolt detection signal in response to determining that the digital frequency value changes by an amount equal to or substantially equal to a defined frequency shift corresponding to a frequency shift induced by the inductive coil in response to presence of the locking bolt within the inductive coil's magnetic field.

17 Claims, 17 Drawing Sheets

(56) References Cited

U.S. PATENT DOCUMENTS

| | | | |
|---|---|---|---|
| 5,532,522 A * | 7/1996 | Dietz | B60R 25/04 |
| | | | 180/287 |
| 6,035,675 A * | 3/2000 | Zimmer | B60R 25/02153 |
| | | | 70/186 |
| 6,079,238 A * | 6/2000 | Hoffmann | E05B 47/0673 |
| | | | 70/283 |
| 6,115,229 A * | 9/2000 | Ahlig | H03K 17/97 |
| | | | 361/179 |
| 9,673,868 B2 * | 6/2017 | Curtis | E05B 47/0001 |
| 11,007,433 B2 * | 5/2021 | Jiang | A63F 13/28 |
| 2009/0058607 A1 | 3/2009 | Hou | |
| 2019/0316381 A1 * | 10/2019 | Oh | F16P 3/08 |

\* cited by examiner

DIAGNOSTIC ELEMENT FOR VALIDATION OF BOLT DETECTION OF A GUARD LOCKING SWITCH IN A STATIC STATE

CROSS-REFERENCE TO RELATED APPLICATION

This application is a continuation of, and claims priority to, U.S. patent application Ser. No. 16/427,661, filed on May 31, 2019, and entitled "DIAGNOSTIC ELEMENT FOR VALIDATION OF BOLT DETECTION OF A GUARD LOCKING SWITCH IN A STATIC STATE." The entirety of the related patent application is incorporated herein by reference.

BACKGROUND

The subject matter disclosed herein relates generally to industrial safety locks, and, more particularly, to internal locking switch sensing and diagnostics.

BRIEF DESCRIPTION

The following presents a simplified summary in order to provide a basic understanding of some aspects described herein. This summary is not an extensive overview nor is intended to identify key/critical elements or to delineate the scope of the various aspects described herein. Its sole purpose is to present some concepts in a simplified form as a prelude to the more detailed description that is presented later.

In one or more embodiments, a locking switch is provided, comprising one or more entry slots configured to receive a locking tongue; a radio frequency identifier (RFID) tag attached to the locking tongue; and a detection circuitry comprising one or more RFID coils, wherein each of the one or more RFID coils is attached to one of the one or more entry slots, wherein the detection circuitry is configured to: generate a current signal through the one or more RFID coils; measure one or more modulations of the current signal; detect insertion of the locking tongue into one of the one or more entry slots based on the measurement; and generate a detection signal in response to the detection of insertion of the locking tongue into one of the one or more entry slots.

Also, a system for sensing a position of a locking bolt of an industrial locking switch is provided, comprising an inductive circuit comprising an inductive coil and a capacitor electrically connected in parallel, wherein the inductive coil is positioned to receive a locking bolt of an industrial locking switch when the locking bolt is transitioned to a lock position; a converter configured to convert a frequency of a current signal on the inductive circuit to a digital frequency value; a master controller configured to generate a bolt detection signal in response to determining that the digital frequency value changes by an amount equal to or substantially equal to a defined frequency shift corresponding to a frequency shift induced by the inductive coil in response to presence of the locking bolt within the inductive coil's magnetic field.

Also, method for detecting positions of a locking bolt of a locking switch is provided, comprising: generating a current signal through an inductive sensing circuit, in response to detecting that a locking tongue is advanced to a locking position, wherein the inductive sensing circuit comprises an inductive coil and a capacitor; converting a frequency of the current signal to a digital frequency value; determining whether a shift in the digital frequency value corresponds to an expected frequency shift of the current signal induced by the inductive coil in response to advancement of the locking bolt; and generating a lock detection signal in response to determining that the shift in the digital frequency value corresponds to the expected frequency shift of the current signal.

To the accomplishment of the foregoing and related ends, certain illustrative aspects are described herein in connection with the following description and the annexed drawings. These aspects are indicative of various ways which can be practiced, all of which are intended to be covered herein. Other advantages and novel features may become apparent from the following detailed description when considered in conjunction with the drawings.

DETAILED DESCRIPTION

Figure 1:
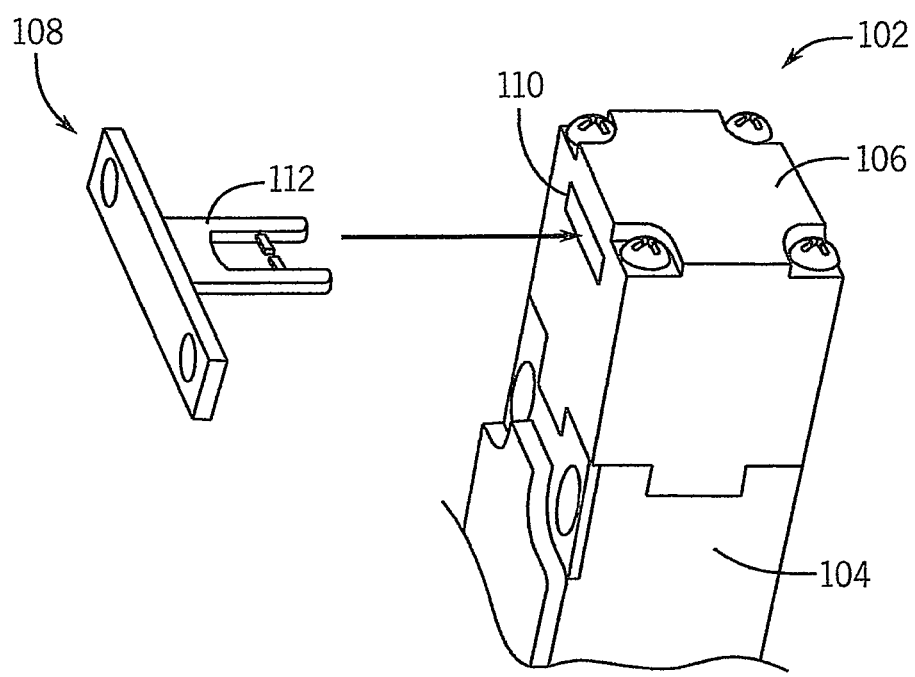
FIG. 1 is a perspective view of an example locking switch and corresponding locking tongue.

The subject disclosure is now described with reference to the drawings, wherein like reference numerals are used to refer to like elements throughout. In the following description, for purposes of explanation, numerous specific details are set forth in order to provide a thorough understanding thereof. It may be evident, however, that the subject disclosure can be practiced without these specific details. In other instances, well-known structures and devices are shown in block diagram form in order to facilitate a description thereof.

In addition, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Furthermore, the term "set" as employed herein excludes the empty set; e.g., the set with no elements therein. Thus, a "set" in the subject disclosure includes one or more elements or entities. As an illustration, a set of controllers includes one or more controllers; a set of holes includes one or more holes; etc.

Various aspects or features will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches also can be used.

Many industrial machines, robots, or automation systems are protected by safety guarding or fencing that surrounds the hazardous area, forming a protected cell. This safety fencing typically includes a lockable safety gate to allow operator access to the protected area only while the machine or system is not operating and is otherwise in a safe state. Solenoid-driven locking switches are often used to lock these safety gates in the closed position while the protected machine or system is operating in automatic mode and all associated safety devices are in their safe statuses, thereby preventing operator access to the hazardous area while the machine is running.

FIG. 1 is a perspective view of an example locking switch 102 and corresponding locking tongue 108. The locking switch 102 is typically mounted to either the frame on which the gate is mounted or on the gate itself. The corresponding locking tongue 108 is mounted on the opposite gate component (either on the gate or on the frame) such that the tongue 108 aligns with an entry slot 110 on the locking switch 102. The locking tongue 108 is generally ring-shaped, having a square or circular engagement hole 112 configured to receive and engage with the switch's internal solenoid-driven locking bolt when the bolt is advanced (not shown in FIG. 1).

When the gate is in the closed position, the locking tongue 108 is received in the entry slot 110 of the locking switch 102. While the protected machine or automation system is in automatic mode or is running, the locking switch 102 actuates a solenoid-driven locking bolt upward through the engagement 112 of the locking tongue 108, preventing removal of the locking tongue 108 from the locking switch 102 and thereby preventing the gate from being opened. Some locking switches 102 are electrically connected to the machine cell's safety system such that the machine or automation system cannot be placed in automatic mode unless the locking tongue 108 is engaged with the locking switch 102.

Example locking switch 102 comprises a main body 104 that houses the solenoid and retractable bolt (while retracted) and an attached head 106 on which the entry slot 110 is formed. Head 106 is removably attached to the body 104 and can be attached to the body 104 in a selected rotational orientation so that the entry slot 110 faces a selected one of three or four possible directions oriented at 90 increments.

In some installation scenarios, an installer or engineer may not have a priori knowledge of the direction from which the tongue 108 will approach the locking switch 102, which may depend on the available mounting options for the tongue 108 and the switch 102. In other scenarios, even if the direction of approach is known, it may be necessary to rotate the switch 102, or to rotate the head 106 relative to the switch, so that the entry slot 110 faces the direction from which the tongue 108 will approach. The structural parameters of the locking switch 102 can limit available mounting options, or may require a labor-intensive mechanical reconfiguration of the locking switch 102 in order to accommodate the requirements of a given mounting scenario.

To address these and other issues, one or more embodiments described herein provide a locking switch configured to accommodate multiple directions of approach of a corresponding locking tongue 108 without the need to rotate the head, body, or switch as a whole. To facilitate detection of the tongue from each of these multiple directions, multiple radio frequency identifier (RFID) coils are also installed in the head of the sensor, each of which is capable of detecting an RFID tag on the tongue when the tongue has been inserted into an entry slot.

Figure 2A:
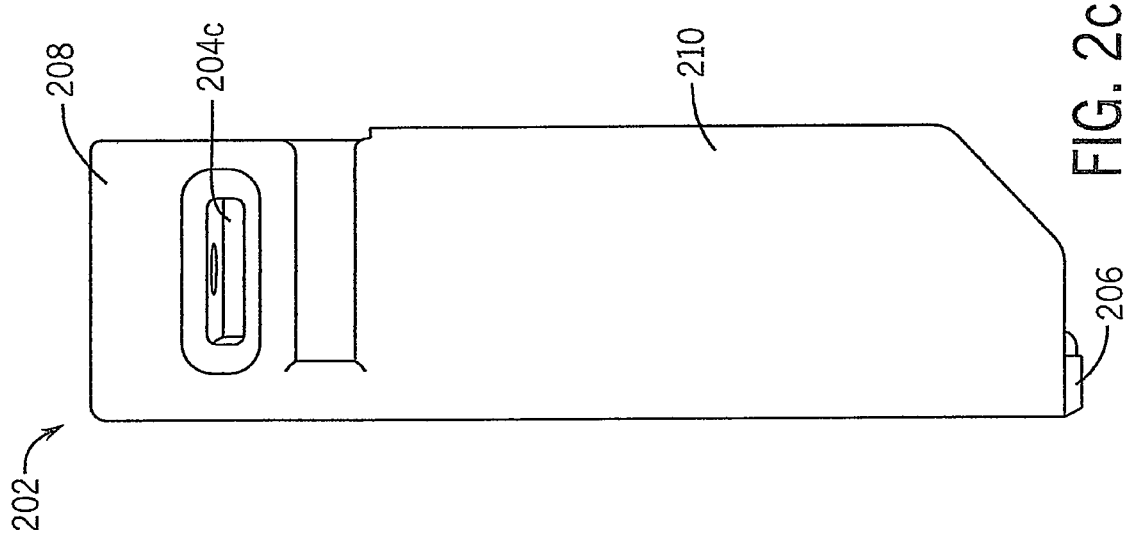
FIG. 2a is a right side view of an example locking switch.
Figure 2B:
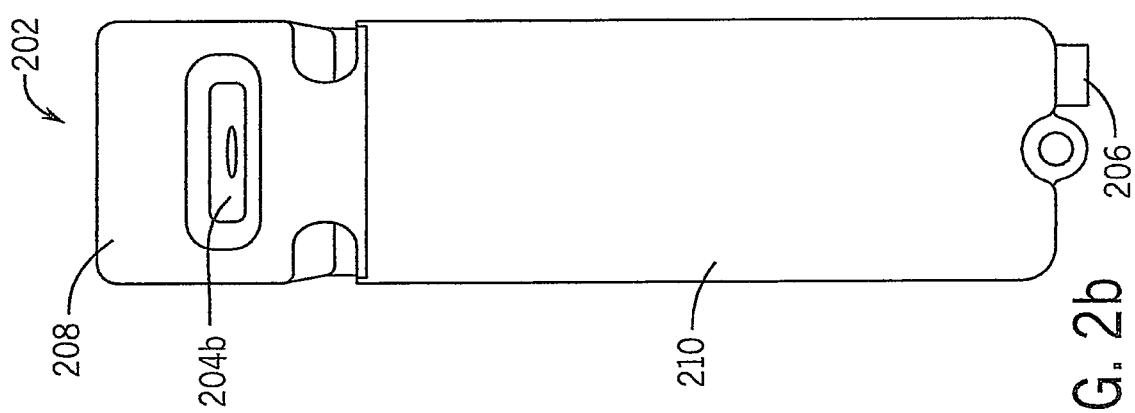
FIG. 2b is a front side view of the example locking switch.
Figure 2C:
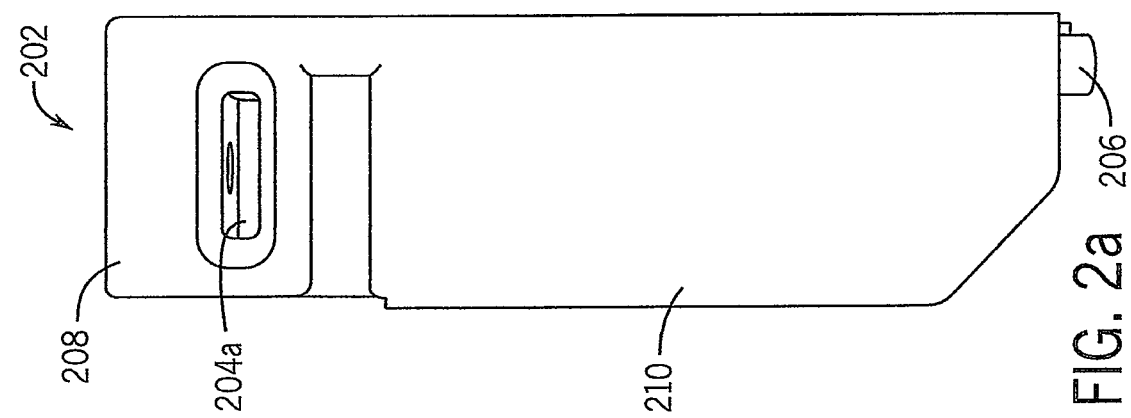
FIG. 2c is a left side view of the example locking switch.
Figure 3:
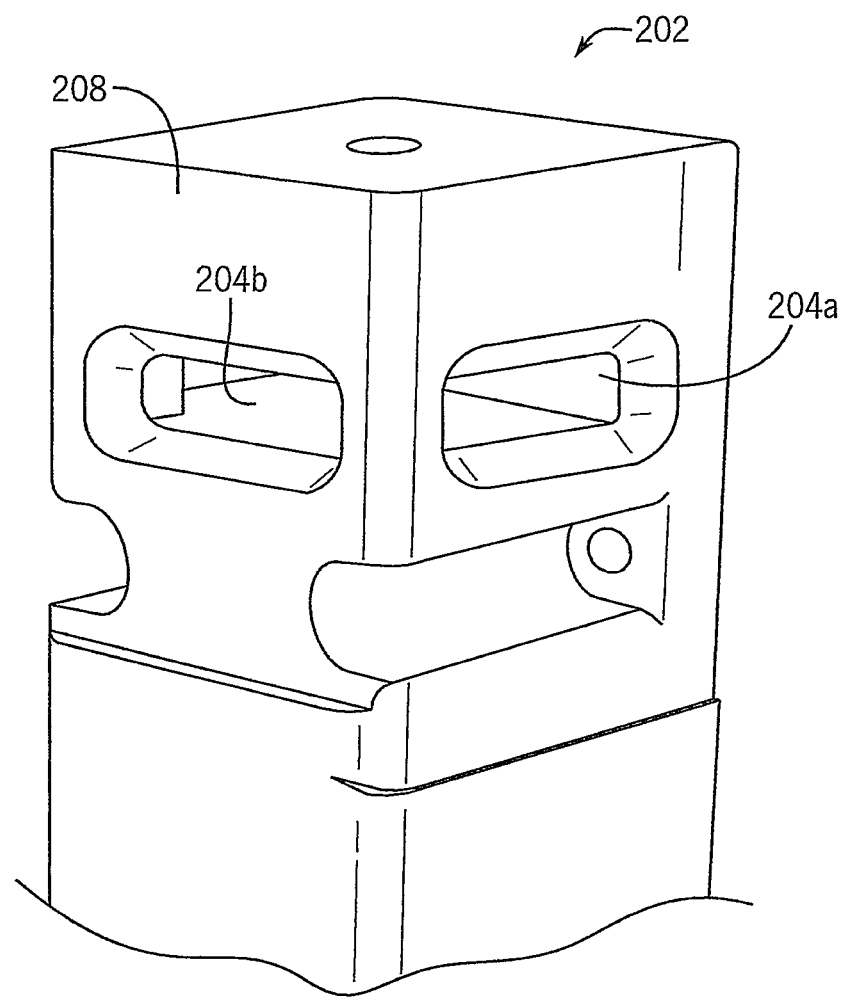
FIG. 3 is a perspective close-up view of the top of an example locking switch.

FIGS. 2a, 2b, and 2c are right side, front, and left side views of an example locking switch 202 according to one or more embodiments. FIG. 3 is a perspective close-up view of the top of locking switch 202. Similar to example switch 102, locking switch 202 comprises a main body 210 that houses the solenoid, locking bolt mechanism, and other electrical and electronic components. A cable port 206 is formed on the body housing 210 to receive power and signal cabling that interfaces with the switch's internal circuitry. Switch 202 also comprises a head 208 mounted to the main body 210. In contrast to head 106 of switch 102, head 208 comprises three entry slots 204a, 204b, and 204c. A first entry slot 204b is formed on a front side of head 208, while entry slots 204a and 204c are formed on the right and left sides of head 208, respectively. This configuration supports three orthogonal directions of approach of a corresponding locking tongue without the need to rotate the head 208 relative to the body 210, or to rotate the switch 202 as a whole.

Embodiments of locking switch 202 can include detection circuitry that detects when the tongue has been inserted into any of the three entry slots 204a, 204b, or 204c, indicating that the locking bolt can be advanced in order to properly engage with the locking tongue. In some embodiments, this detection circuitry can control an output signal (e.g. sent via a cable installed through cable port 206) that indicates whether the locking tongue is inserted into one of the entry slots 204*a*, 204*b*, or 204*c*. In some implementations, this output signal may be used to control when the locking bolt transitions from the retracted (unlocked) position to the advanced (locked) position.

Figure 4:
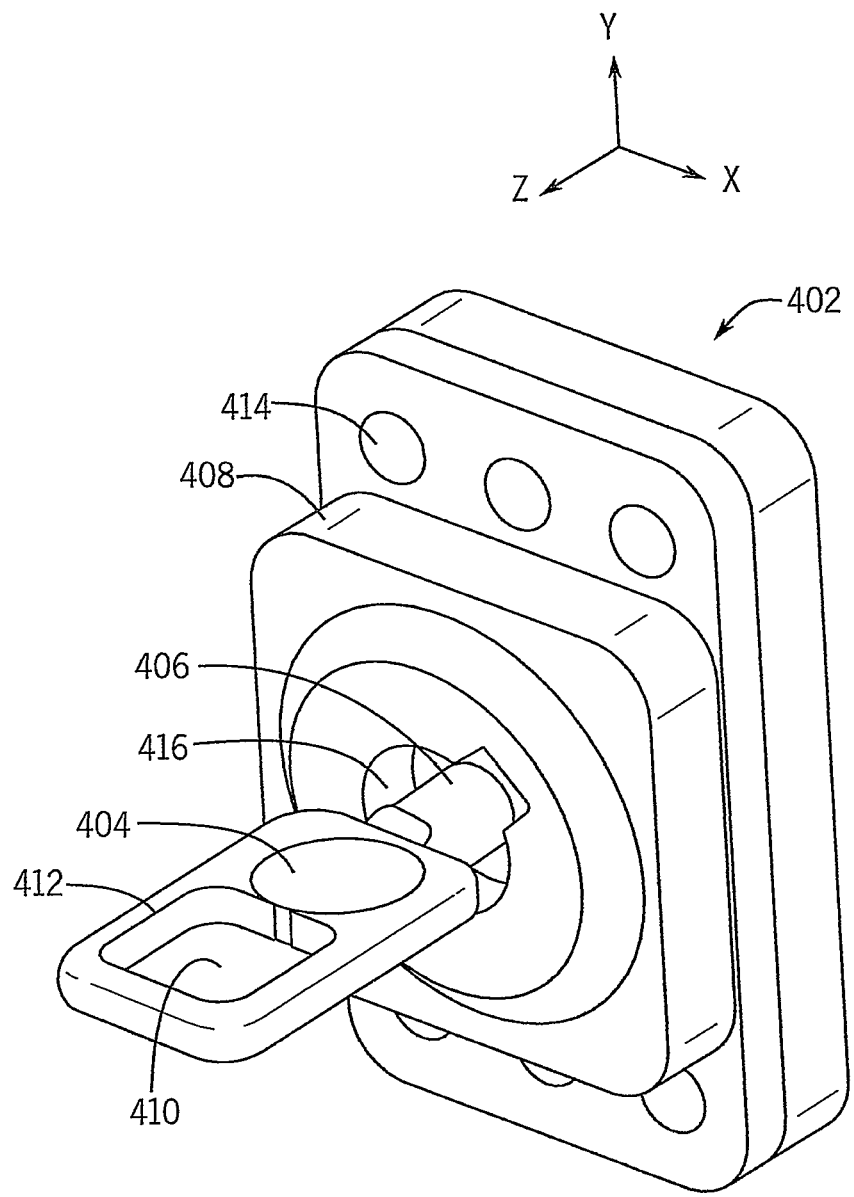
FIG. 4 is a perspective view of an example actuator assembly that includes an RFID tag that can be detected by RFID coils housed in a locking switch.

FIG. 4 is a perspective view of an example actuator assembly 402 that can be used with locking switch 202, and which includes an RFID tag 404 that can be detected by RFID coils housed in the switch 202 (to be discussed in more detail below). Actuator assembly 402 comprises a base 408 in which is mounted a locking tongue 412 (or locking key) configured to engage with any of the entry slots 204*a*, 204*b*, or 204*c* of locking switch 202. Mounting holes 414 are formed through base 408 and can be used in connection with mounting hardware to mount the actuator assembly 402 to a structure (e.g., the frame on which a safety gate is mounted or the gate itself).

Locking tongue 412 is formed on one end of an actuating shaft 406, and the other end of actuating shaft 406 is installed within a recess 416 of base 408. In the example depicted in FIG. 4, tongue 412 has formed therein a substantially square bolt engagement hole 410 configured to receive the locking switch's locking bolt when the bolt is advanced, although bolt engagement holes of other shapes are also within the scope of one or more embodiments. RFID tag 404 is mounted in the tongue 412 within a circular mounting feature (e.g., a hole or recess) formed in the tongue 412 adjacent to the bolt engagement hole 410. When tongue 412 is inserted within any of the entry slots 204*a*, 204*b*, or 204*c*, RFID coils mounted in the locking switch's head 208 can detect the presence of the RFID tag 404 and thereby confirm that the tongue 412 is inserted into the locking switch 202 and that the locking bolt can be engaged.

Figure 5B:
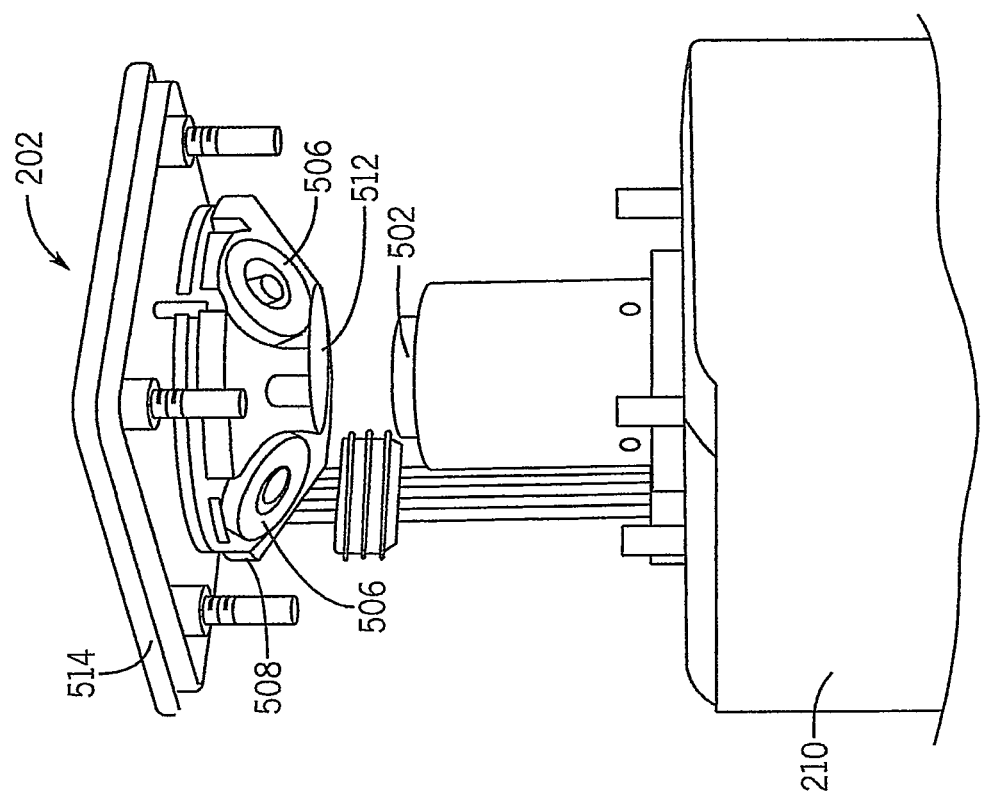
FIG. 5b is a perspective view of the top of an example locking switch with both the casing of the switch's head and the switch's coil housing removed.
Figure 5A:
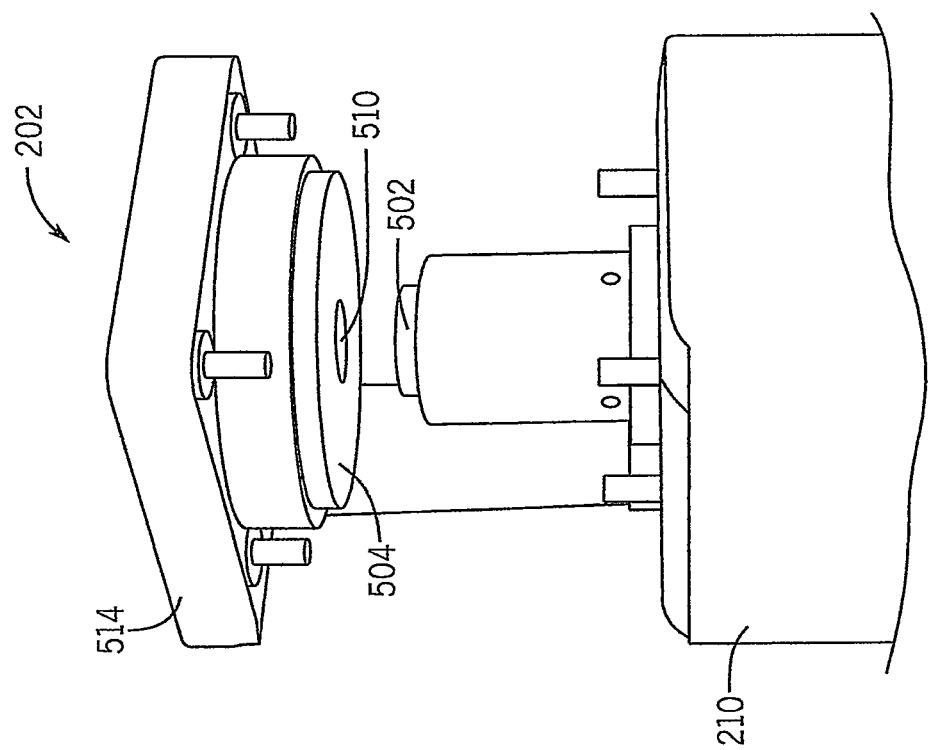
FIG. 5a is a perspective view of the top of a locking switch with the casing of the switch's head removed, revealing the switch's solenoid-driven locking bolt.

FIG. 5*a* is a perspective view of the top of locking switch 202 with the casing of head 208 removed, revealing a bushing 502 within which is housed the solenoid-driven locking bolt that, when advanced, engages with the inserted tongue 412. A coil housing 504 is mounted above the locking bolt bushing 502 on the ceiling 514 of locking switch 202. FIG. 5*b* is a perspective view of the top of locking switch 202 with both the casing of head 208 and the coil housing 504 removed. Enclosed within the coil housing 504 are three RFID coils 506 electrically connected in series, each coil 506 corresponding to a different one of the three entry slots 204*a*, 204*b*, and 204*c*. When head 208 is in place, each coil 506 is oriented above one of the entry slots 204*a*, 204*b*, and 204*c* to facilitate detection of the tongue's RFID tag 404. The series-connected RFID coils 506 are components of a detection circuit housed in the locking switch 202, which controls an output signal based on detection of the presence of the RFID tag 404.

Figure 6:
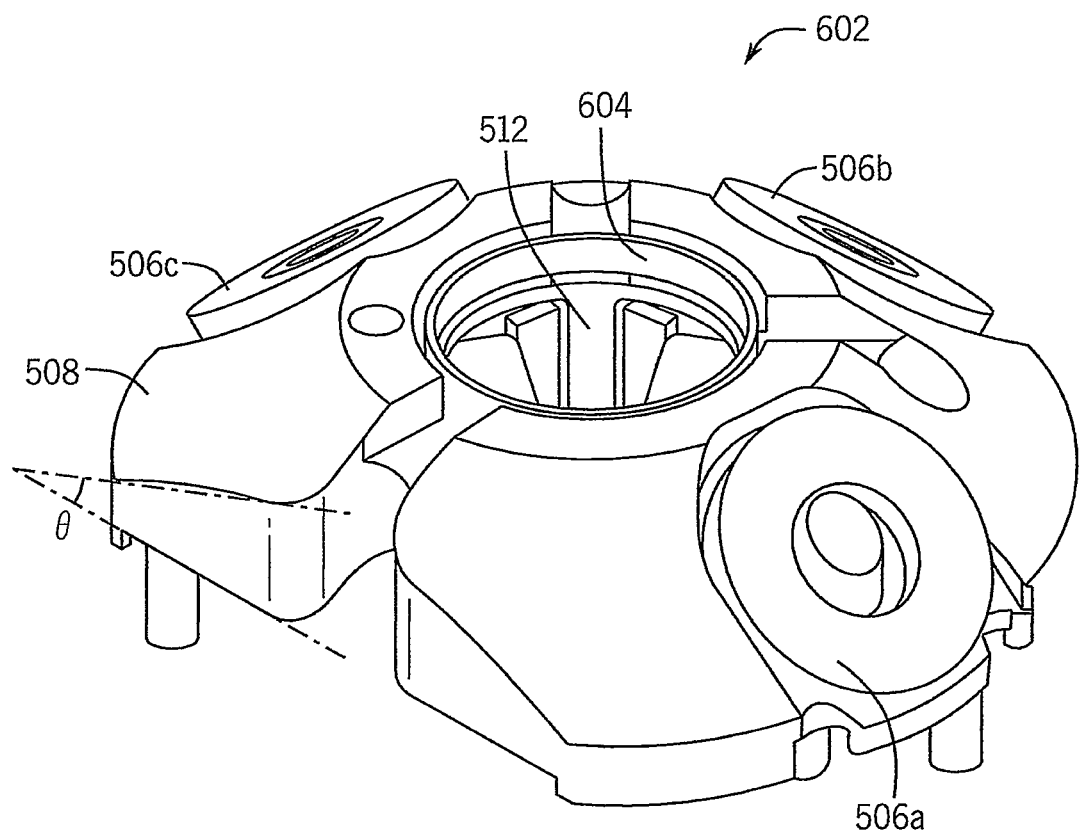
FIG. 6 is a perspective, cross-sectional view of a bobbin assembly.

As shown in FIG. 5*b*, RFID coils 506 are mounted on bobbin 508, which is mounted to the ceiling 514 of the locking switch 202. FIG. 6 is a perspective, cross-sectional view of a bobbin assembly 602 comprising bobbin 508 and coils 506*a*, 506*b*, and 506*c*. Bobbin 508 has a substantially round profile and a top surface (or coil mounting surface) that slants upward from its edge to its center, yielding a top surface having a degree of tilt θ relative to the bottom surface (that is, the surface that mounts to the locking switch's housing). In an example embodiment θ may be approximately 38 degrees. However, other degrees of tilt are also within the scope of one or more embodiments. An opening 512 is formed in the center of bobbin 508 and is configured to receive the locking bolt when the bolt is advanced.

RFID coils 506*a*, 506*b*, and 506*c* are mounted on the slanted top surface of bobbin 508. As a result, when bobbin 508 is mounted in the locking switch 202, each RFID coil 504 is tilted relative to the plane of the ceiling 514 such that the coil's axis—and consequently the coil's sensing field— is directed outward from the center of the bobbin 508. Tilting the RFID coils 504 in this manner can increase the lateral sensing distance of each RFID coil 504, allowing the tongue's RFID tag 404 to be detected before the tongue 412 is fully inserted into the entry slot 204. This feature, together with the relatively large size of the tongue's engagement hole 410, can promote a large degree of mechanical freedom when aligning the engagement hole with locking bolt, as discussed in more detail below.

Figure 7:
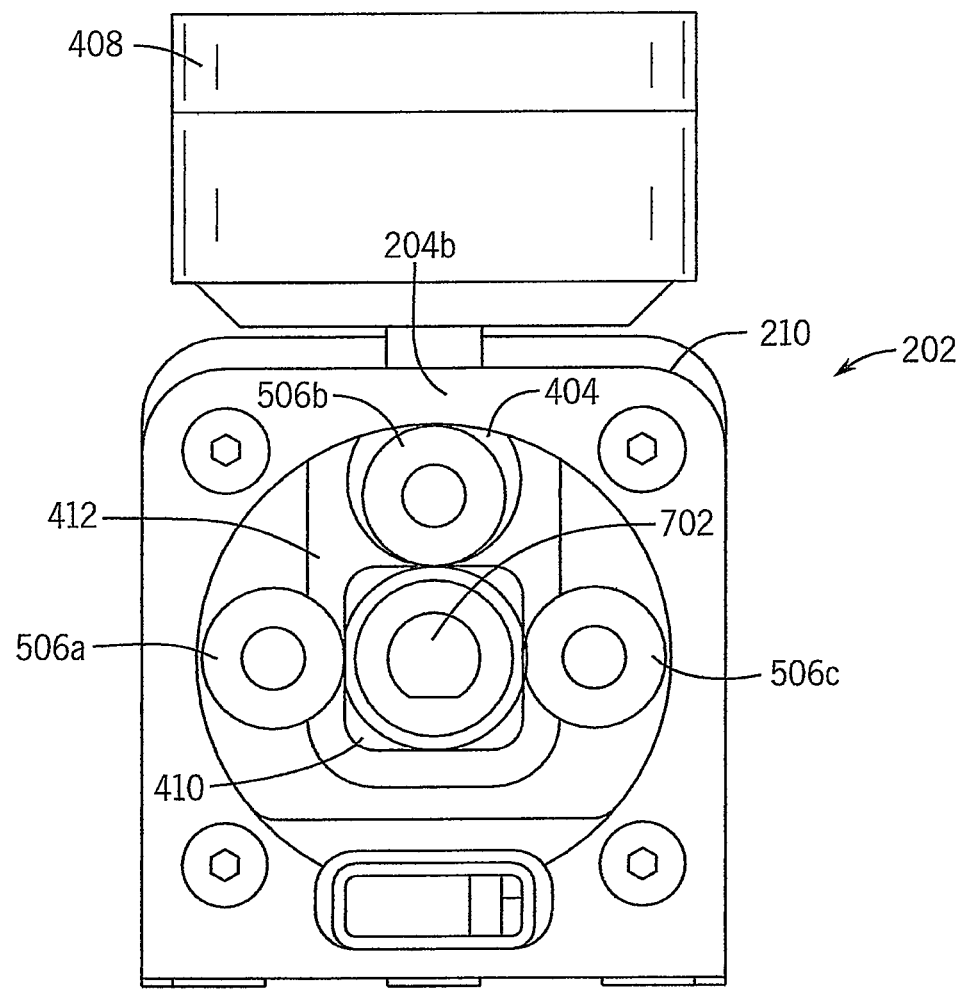
FIG. 7 is a cross-sectional top view of a locking switch with a locking tongue inserted into the switch's front facing entry slot.
Figure 8:
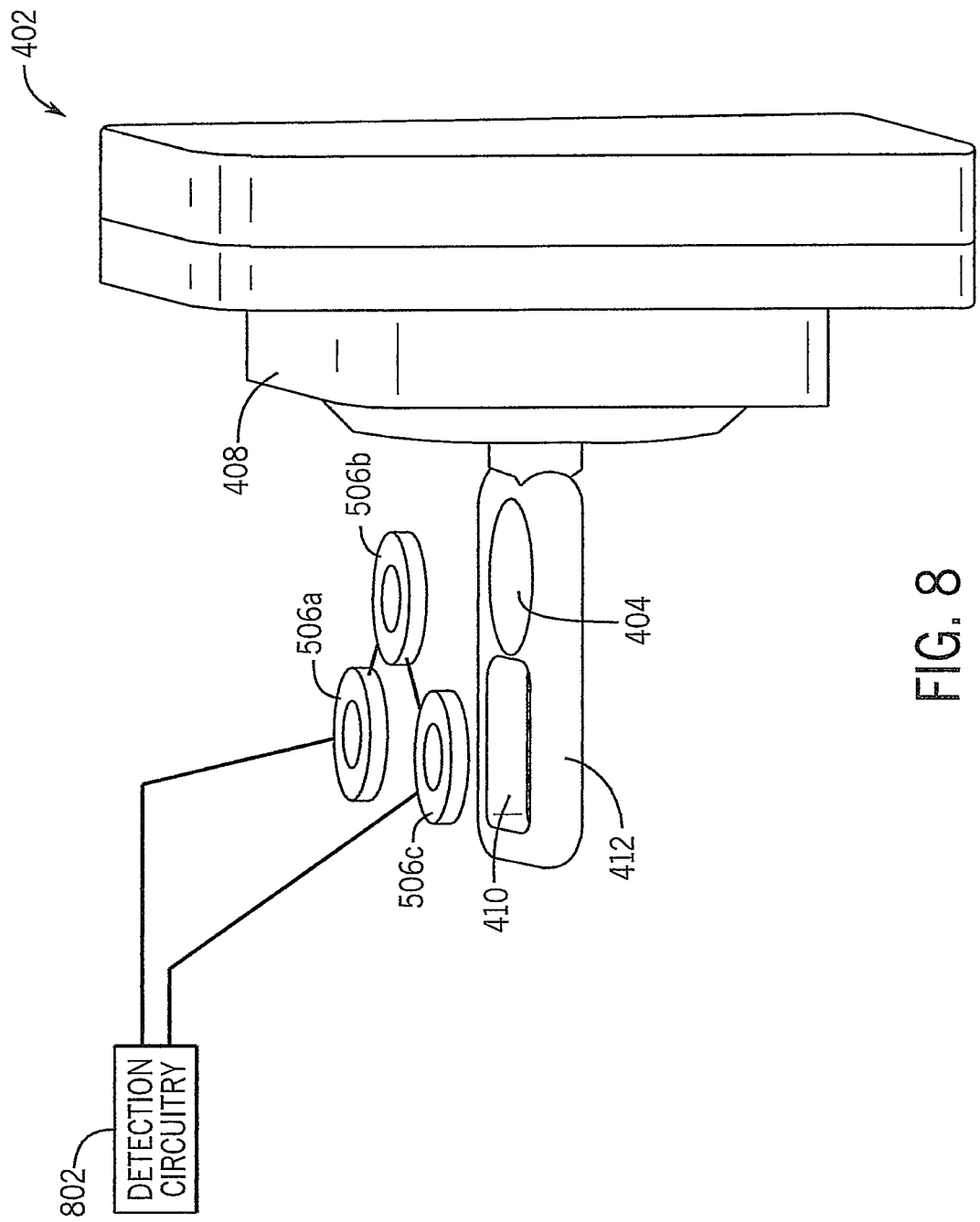
FIG. 8 is a perspective view depicting relative positions of an actuator assembly and RFID coils when the actuator assembly's locking tongue is inserted into an entry slot of a locking switch.

FIG. 7 is a cross-sectional top view of locking switch 202 with the tongue 412 of actuator assembly 402 inserted into the front facing entry slot 204*b*. FIG. 8 is a perspective view depicting relative positions of the actuator assembly 402 and RFID coils 506*a*, 506*b*, and 506*c* when the tongue 412 is inserted into the front facing entry slot 204*b* (for clarity, FIGS. 7 and 8 depict RFID coils 506 as being oriented to reside in the same plane rather than being tilted; however, in some embodiments the RFID coils 506 will be tilted by bobbin 508 as shown in FIGS. 5*b* and 6). As shown in these figures, bolt engagement hole 410 aligns with the locking bolt 702 and RFID tag 404 resides below RFID coil 506 while tongue 412 is inserted into the entry slot 204. RFID coils 506*a*, 506*b*, and 506*c* are connected in series and are electrically driven by detection circuitry 802 inside the sensor's housing to generate three separate electromagnetic fields. This detection circuitry 802 includes an RFID transceiver that detects disturbances to any of the three electromagnetic fields due to the presence of RFID tag 404 within range of the electromagnetic field. Such disturbances modulate an RFID current signal into the detection circuitry 802, which detects the presence of the tongue 412 based on these current signal modulations.

Since RFID coils 506*a*, 506*b*, and 506*c* are connected in series, disturbances to any of the three electromagnetic fields generated by the respective three coils 506 are detected by the RFID transceiver of detection circuitry 802. Thus, a single RFID transceiver can be used to detect entry of the tongue 412 into any of the three entry slots 204*a*, 204*b*, and 204*c*, mitigating the need for three separate RFID transceivers. This configuration can also yield a relatively fast response time, since the tongue's RFID tag 404 can be detected from multiple directions by monitoring only one signal, without the need to multiplex signals or analyze multiple signal lines. In some embodiments, the middle RFID coil 506*b* can be flipped in polarity relative to the polarities of RFID coils 506*a* and 506*c*, partially cancelling the magnetic field in the center of coil 604 and reducing interfere of the RFID signal on the bolt detection signal.

Figure 9:
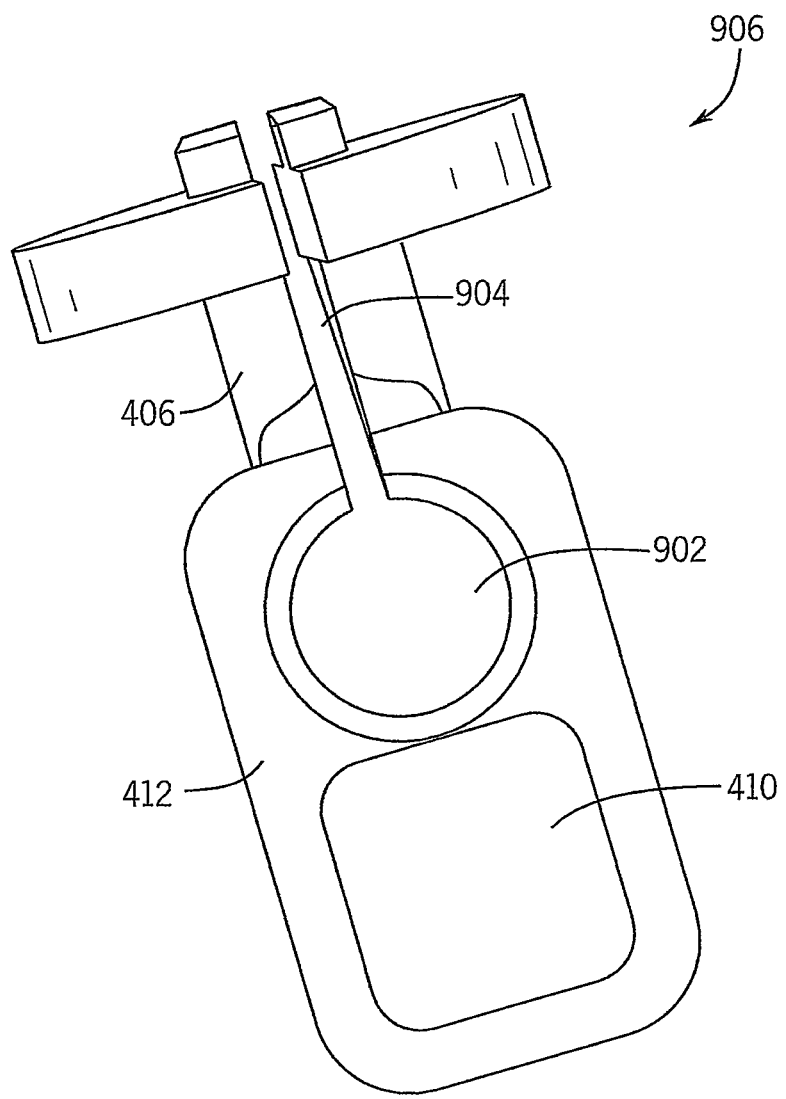
FIG. 9 is a top view of an example tongue component that can be used in an actuator assembly to prevent premature detection due to parasitic effects.

FIG. 9 is a top view of an example tongue component 906 that can be used in the actuator assembly 402 to prevent premature detection due to parasitic effects. As shown in this figure, tongue component 906 comprises a gap 904 that runs from the edge of RFID tag mounting hole 902 (in which the RFID tag 404 resides) through the entire length of the articulating shaft 406, splitting the articulating shaft 406 along its lengthwise axis. Gap 904 is designed to mitigate potential parasitic effects of the metal tongue component 906 that could otherwise cause the tongue 412 to act as an antenna in the presence of the RFID coils' magnetic fields, resulting in premature detection of the tongue 412 before the tongue is inserted to a viable locking depth.

This electrical configuration, together with the mechanical design of the locking switch's head 208, affords a degree of installation flexibility by supporting three different directions of approach of the tongue 412 without the need to rotate head 208 or, in some cases, to re-orient the locking switch as a whole. This arrangement is supported by an electrical detection system that can detect entry of the tongue 412 from any of the multiple directions by monitoring a single electrical signal with one sensor.

As noted above, RFID coils 506 can be tilted outward by virtue of the slanted surface of bobbin 508 (see FIG. 6). This extends the sensing distance of each RFID coil 506 and allows the detection circuitry 802 to detect the tongue's RFID tag 404 before the tongue 412 is fully inserted into an entry slot 204. This extended detection distance can work in conjunction with an engagement hole 410 that is sized to be considerably larger than the locking bolt 702 to introduce a large degree of misalignment tolerance between the tongue 412 and the locking bolt 702. That is, sizing the tongue's engagement hole 410 to be larger than the cross-sectional profile of the locking bolt 702 allows the locking bolt 702 to successfully engage with the tongue's engagement hole across a larger range of tongue insertion depths than would be possible if the engagement hole 410 was sized more closely to the locking bolt's profile. Since this design does not require the tongue 412 to be fully inserted into an entrance slot 204 before the locking bolt 702 can be engaged, the extended sensing distance that results from tilting of the RFID coils 506 as shown in FIG. 6 can facilitate detection of the RFID tag 404 at the earliest insertion position at which the locking bolt 702 can be safely advanced while ensuring reliable engagement with the engagement hole 410.

In some embodiments, a further degree of misalignment tolerance between the tongue 412 and the locking switch 202 can be achieved by designing the actuator assembly 402 such that the tongue 412 can articulate within the base 408 to a limited degree. Returning to FIG. 4, tongue 412 is formed on one end of an articulating shaft 406 that is mounted within a recess 416 of base 408. The shaft 406 is unrestrained in the x-y plane (that is, the plane parallel with the front face of the base 408), allowing the shaft 406 and tongue 412 to pivot away from its normal axis relative to base 408 within the bounds of recess 416. In some embodiments, the shaft 406 may also be afforded limited sliding movement along the z-axis (perpendicular to the face of base 408). Designing the actuator assembly 402 to permit a limited degree of tongue articulation in this manner further increases the misalignment tolerance between the tongue 412 and the locking switch 202, allowing the tongue 412 to be inserted into an entry slot 204 and engaged with the locking bolt 503 even if the tongue 412 is imperfectly aligned with these switch components.

Figure 10:
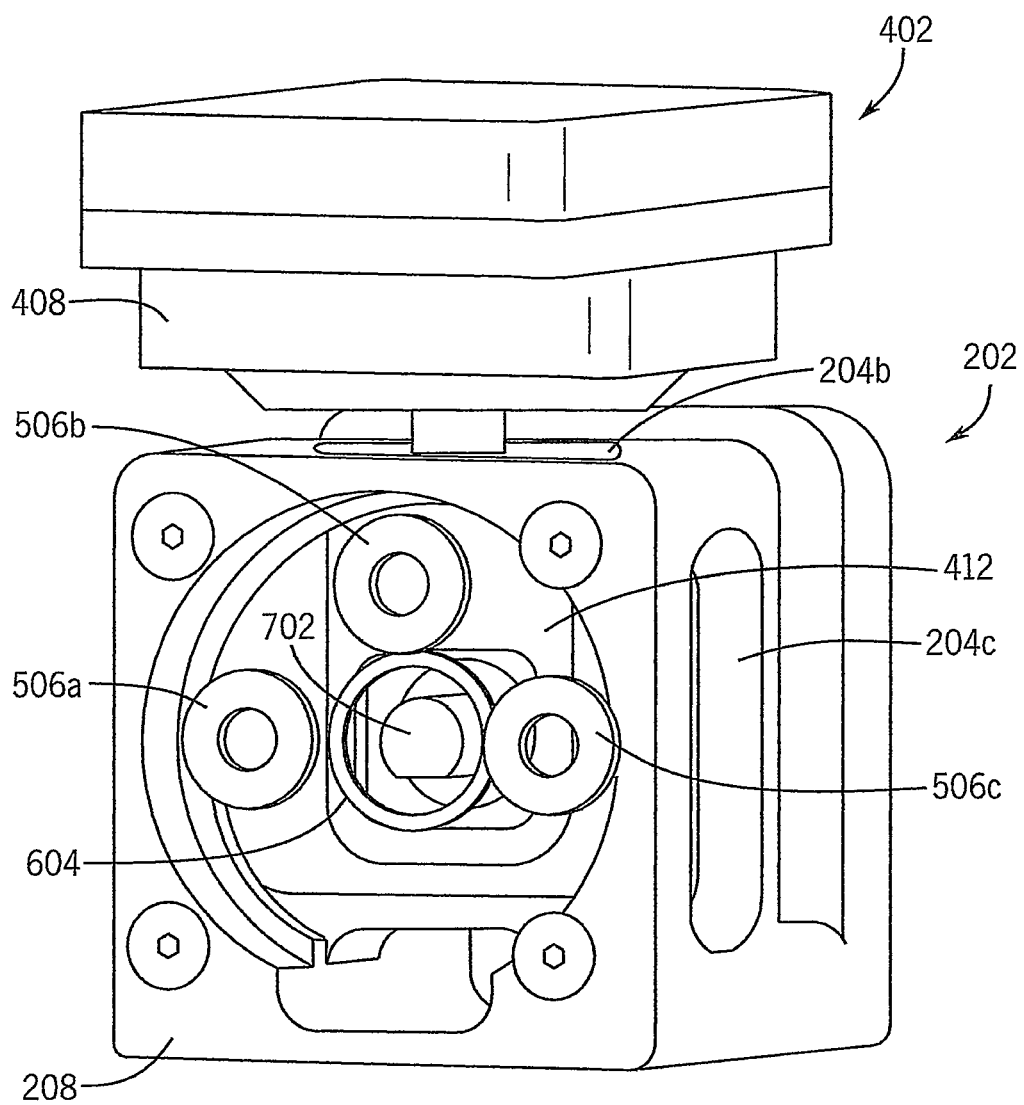
FIG. 10 is a cross-sectional view of a locking switch's head with an actuator assembly inserted and engaged with the locking switch.

Returning now to FIG. 6, some embodiments of bobbin assembly 602 may also include an inductive coil 604 mounted within the opening 512 of the bobbin 508. Coil 604 is part of an LC tank circuit housed within the switch housing used to detect and confirm that the locking bolt 702 has been advanced. FIG. 10 is a cross-sectional view of the locking switch's head 208 with actuator assembly 402 inserted and engaged with the locking switch. For clarity, the bobbin 508 is omitted from this view to illustrate the positions of RFID coils 506 and inductive coil 604. An LC tank circuit including inductive coil 604 in parallel with a capacitor (not shown in FIG. 10) acts as an inductive sensor that detects when the locking bolt 702 is in the advanced position. For example, the circuit can drive an alternating current through the coil 604, where the frequency of the current is a function of the inductance of the coil 604. Inductive coil 604 resides along the edge of the bobbin's central opening 512 so that locking bolt 702 passes through the coil 604 when advanced to the locked position. While locking bolt 702 is in the advanced (locked) position, the presence of the metal locking bolt 702 within the coil's magnetic field changes the inductance of the coil 604, and thus changes the frequency of the current signal. This change in the frequency of the current signal is detected by the LC tank circuit which generates a confirmation signal in response, indicating that the locking bolt 702 is in the advanced position. Thus, inductive coil 604 and its associated LC tank circuit provide a non-contact method for confirming that locking bolt 702 has properly advanced and engaged with tongue 412. The use of an inductive sensor allows the position of locking bolt 702 to be detected without the use of a magnet or optical sensing, yielding a robust solution for bolt detection.

Figure 11:
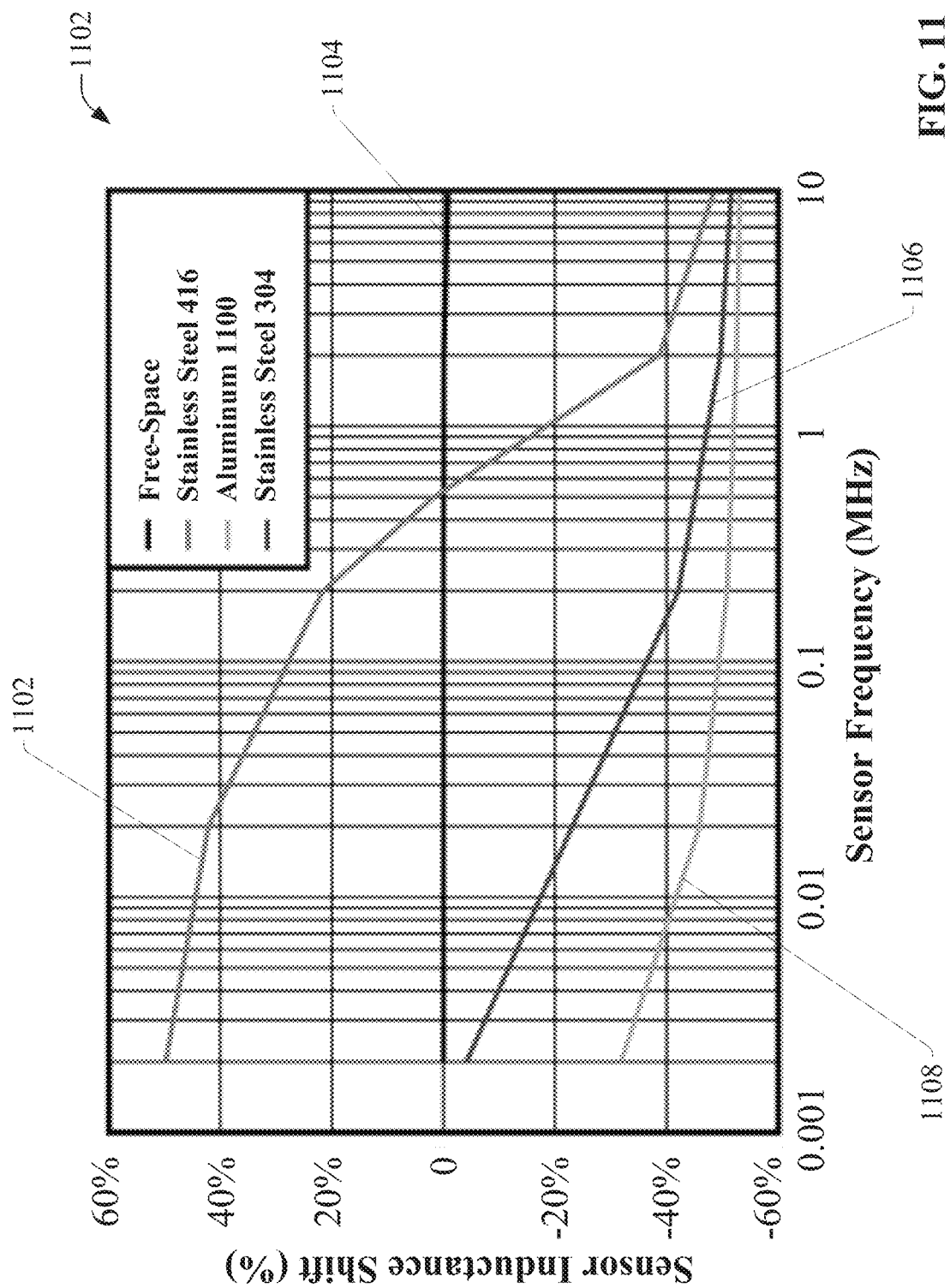
FIG. 11 is a graph that plots sensor inductance shift as a function of sensor frequency for a variety of materials.

For embodiments of locking switch 202 that include both inductive coil 604 for detecting the locking bolt 702 and RFID coils 506 detecting the locking tongue 412, different types of metal can be used for the tongue 412 and the bolt 702 to ensure that the inductive coil 604 reliably detects locking bolt 702 without detecting the locking tongue 412. In general, the metal used to fabricate the locking bolt 702 can be chosen as one having intrinsic properties that cause the inductive coil 604 to induce a greater frequency shift than those of the metal chosen for the locking tongue 412. In an example embodiment, locking tongue 412 can be made of 400 series stainless steel (e.g., 416, 410, etc.), while locking bolt 702 can be made from 300 series stainless steel. FIG. 11 is a graph 1102 that plots sensor inductance shift as a function of sensor frequency for a variety of materials. The amount of sensor inductance shift is a function of intrinsic properties of the respective materials. The horizontal line 1104 represents the lack of frequency shift when no metal is present (free space). The top line 1102 represents the inductance shift of stainless steel 416, line 1106 represents the inductance shift of stainless steel 304, and the bottom line represents the inductance shift of aluminum 1100. If stainless steel 416 and stainless steel 304 are chosen as the materials for locking tongue 412 and locking bolt 702, respectively, the relative inductance shifts modeled by graph 1102 can be used to find an operating frequency for the inductive sensor (including inductive coil 604) that maximizes detection of locking bolt 702 while minimizing detection of the locking tongue 412; e.g., by selecting a sensor operating frequency corresponding to a sufficiently large inductance shift for stainless steel 416 (line 1102) to ensure reliable detection of the locking bolt 702, and a sufficiently small inductance shift for stainless steel 304 (line 1106) to ensure that the locking tongue 412 is not detected by the inductive sensor.

Also, for embodiments in which both inductive coil 604 and RFID coils 506 are included in the same locking switch, the tilting of the RFID coils 506 due to the slanted surface of bobbin 508 can minimize the risk of interference between the RFID coils 506 and inductive coil 604, since the RFID coils are tilted relative to the inductive coil causing the sensing fields of the RFID coils to be directed away from that of the inductive coil. In some embodiments, the RFID coils 506 and inductive coil 604 can be operated at different operating frequencies (e.g., 500 kHz for the inductive coil 604 and 125 kHz for the RFID coils 506) to further minimize the risk of interference between the two sensing systems.

Industrial safety applications can be made more robust if their associated locking switches are capable of validating proper operation of their locking bolts. This can include validating that the locking switch is capable of reliably confirming the actual position of the locking bolt. Some locking switches may perform this validation by advancing the locking bolt to the locked position and then retracting the bolt back to the unlocked position during a test sequence, and confirming that the bolt detection signal was properly received. However, since this validation approach requires the locking bolt to be actuated, normal operation of the switch must be interrupted in order to validate locking bolt detection. If the locking switch is currently holding a safety gate in the closed and locked position, actuating the locking bolt during this test sequence causes the safety gate to become temporarily unlocked, creating a potential safety hazard.

Figure 12:
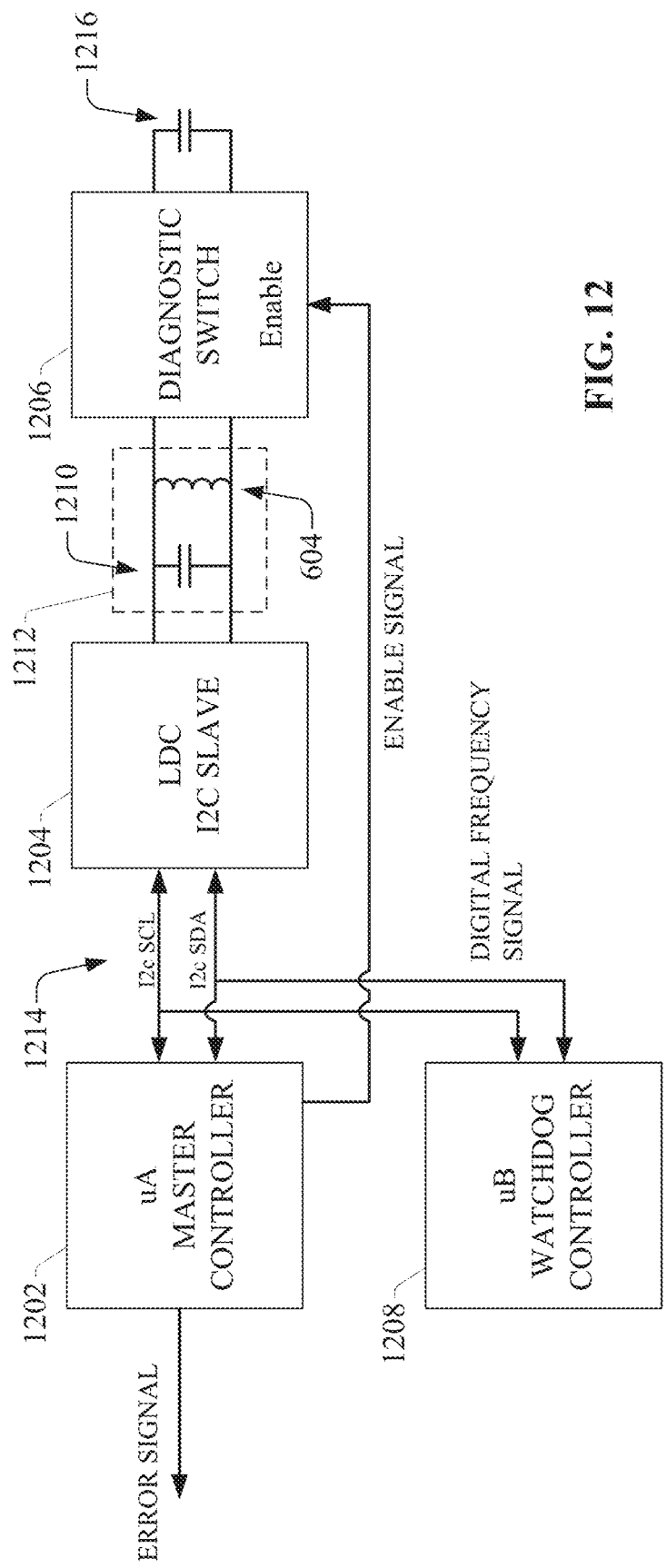
FIG. 12 is a generalized diagram of an example validation circuit that includes diagnostic circuitry capable of confirming the locking switch's bolt detection capability without interrupting the function of the switch.

To address this issue, one or more embodiments of locking switch 202 can include validation circuitry that validates operation of the lock detection signal without requiring the locking bolt 702 to be actuated or otherwise interrupting the functionality of the locking switch 202. FIG. 12 is a generalized diagram of an example validation circuit that includes diagnostic circuitry capable of confirming the locking switch's bolt detection capability without interrupting the function of the switch 202. In this example, the LC tank circuit 1212 used to detect the locking bolt 702 while in its advanced (locking) position comprises the inductive coil 604 (which can be mounted in bobbin 508 in some embodiments, as discussed above) and a capacitor 1210 connected in parallel. An inductance-to-digital converter (LDC) 1204 (or another type of conversion component) is connected to the nodes of LC tank circuit 1212 and translates the measured frequency of the current signal generated by the LC circuit 1212 to digital data that is placed on a data bus 1214 (e.g., an I2C bus or another type of data bus). This frequency signal is indicative of the inductance of coil 604, which in turn is a function of the presence or absence of locking bolt 702 within the magnetic field of inductive coil 604. Although FIG. 12 depicts an LDC 1204 as the conversion component used to translate the current signal frequency to digital data, other types of conversion components can also be used to generate a digital value proportionate to the current signal frequency in some embodiments.

A master controller 1202 on the data bus 1214 monitors the digital frequency signal on the data bus 1214 and confirms that the locking bolt 702 has properly advanced— or has properly retracted—based on measured changes to the digital frequency value. For reliability purposes, some embodiments may also include a watchdog controller 1208 that is tied to the data bus 1214 and performs redundant monitoring of the digital frequency signal. In some embodiments, both the master controller 1202 and the watchdog controller 1208 may perform parallel independent monitoring of the digital frequency signal and collectively confirm the position of the locking bolt 702 only if both controllers 1202 and 1208 reach the same conclusion. In some embodiments, the master controller 1202 and/or the watchdog controller generates a confirmation signal in response to this confirmation that the locking bolt 702 has advanced.

To verify that this locking bolt validation system is reliably monitoring and reporting the state of the locking bolt, a diagnostic capacitor 1216 is connected to the LC tank circuit 1212 via a diagnostic switch 1206 (e.g., a solid state switching device). Diagnostic capacitor 1216 remains isolated from the LC tank circuit 1212 while the diagnostic switch 1206 is disabled. During a diagnostic sequence initiated and controlled by the master controller 1202, the diagnostic switch 1206 is enabled (e.g., by a signal applied to the diagnostic switch's Enable input by master controller 1202), which causes the diagnostic capacitor 1216 to be electrically connected to the LC tank circuit 1212 in parallel with capacitor 1210. The capacitance of diagnostic capacitor 1216 is sized such that connecting the diagnostic capacitor 1216 in parallel with tank capacitor 1210 creates a shift in the frequency of the current signal through the LC tank circuit 1212 that is roughly the equivalent of the frequency shift caused by the presence of the locking bolt 702 within the magnetic field of coil 604. That is, whereas advancement of locking bolt 702 to the locked position changes the inductance of coil 604 in a manner that alters the frequency of the current through the LC tank circuit 1212 by a predictable frequency shift magnitude, connecting diagnostic capacitor 1216 to the LC tank circuit 1212 (by enabling diagnostic switch 1206) changes the capacitance of the LC tank circuit 1212 in a manner that alters the frequency by a substantially equal frequency shift magnitude.

During the diagnostic sequence, master controller 1202 can enable the diagnostic switch 1206 and monitor the digital frequency value generated by the LDC 1204 to verify that the frequency value changes as expected. For example, during normal operation of the locking switch 202 the master controller 1202 can monitor the digital frequency value on bus 1214 and, in response to determining that the frequency value changes by a defined frequency shift magnitude indicative of the presence of the locking bolt within the coil's magnetic field, generate a confirmation signal indicating that the locking bolt 702 has been advanced. The defined frequency shift magnitude may be defined as a valid frequency shift range to allow for small frequency variations.

During a diagnostic sequence, master controller 1202 can enable diagnostic switch 1106 and, in response to determining that the digital frequency value shifts by the defined frequency shift magnitude (within a defined tolerance) within an expected time duration after enabling the diagnostic switch 1206, confirm that the locking bolt validation system is operating properly and is capable of reliable detecting the state of the locking bolt 702. Alternatively, if the master controller 1202 determines that the digital frequency value has not shifted by the defined frequency shift magnitude within the defined time duration after enabling the diagnostic switch 1206, the master controller 1202 generates an error signal. The error signal may include an error message rendered on a client device indicating that the locking bolt validation system is not working properly, or may be an error signal sent to an external safety or control system. This diagnostic sequence can be performed regardless of whether the locking bolt 702 is currently advanced or retracted, and does not require the locking bolt 702 to be physically actuated in order to validate the LC tank circuit 1212 and its associated LDC 1204. During the diagnostic sequence, any control outputs from the locking switch 202 that would otherwise be generated in response to detecting that the locking bolt has been advanced are disabled to prevent false indications being sent to external control or safety systems.

In contrast to locking switches that employ two separate optical sensors to detect the locking bolt's lock and unlock positions, respectively, the use of an inductive sensor (LC tank circuit 1212) with associated diagnostic circuitry requires only a single sensor to confirm the position of the locking bolt 702 in a robust and reliable manner.

Figure 13:
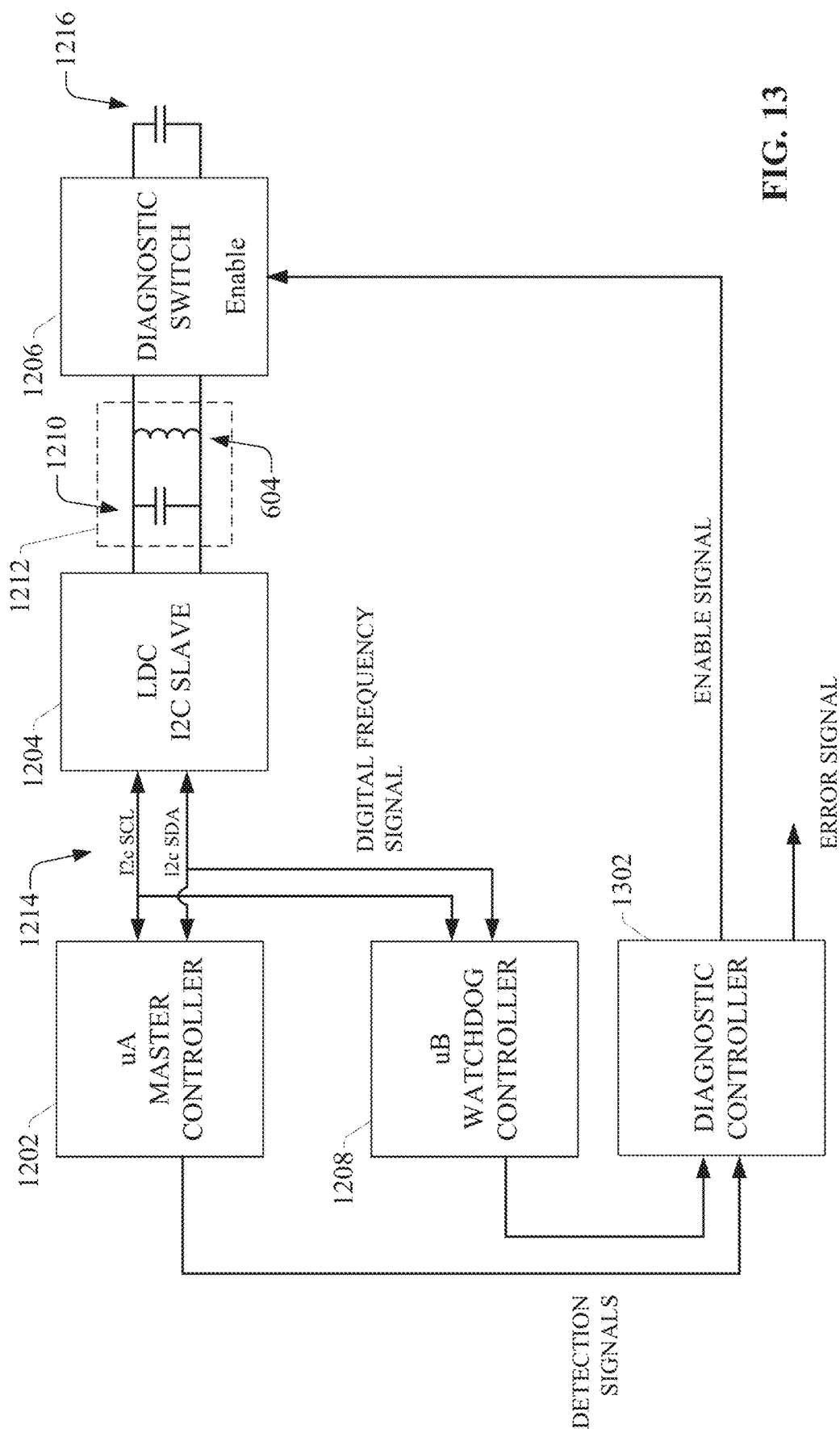
FIG. 13 is a generalized diagram of another example embodiment of a locking bolt validation circuit including diagnostic circuitry.

FIG. 13 is a generalized diagram of another example embodiment of locking bolt validation circuit including diagnostic circuitry. This example embodiment adds a separate diagnostic controller 1302 so that operation of the master controller 1202 and watchdog controller 1208 is included in the scope of validation. In contrast to the embodiment depicted in FIG. 12, the enable signal that controls the state of diagnostic switch 1206 is generated by this new diagnostic controller 1302 rather than by master controller 1202. Diagnostic controller 1302 validates operation of the locking bolt detection circuitry by monitoring outputs of the master controller 1202 and watchdog controller 1208 rather than by monitoring the digital frequency signal directly as in the embodiment depicted in FIG. 12.

In this embodiment, during the diagnostic sequence, diagnostic controller 1302 enables switch 1206 and monitors the detection signals generated master controller 1202 and watchdog controller 1208. Each controller 1202 and 1208 generates its detection signal in response to detecting the expected shift in the digital frequency signal caused by switching the diagnostic capacitor 1216 to the LC tank circuit 1212. If the detection signals from both the master controller 1202 and watchdog controller 1208 indicate that the expected frequency shift has been detected within a defined time duration after generating the enable signal, diagnostic controller 1302 determines that the locking bolt detection circuitry is operating properly. Alternatively, if diagnostic controller 1302 does not received one or both of the detection signals from the master controller 1202 or the watchdog controller 1208 within the defined time duration after initiating the enable signal, the diagnostic controller 1302 determines that the locking bolt detection circuitry is not functioning properly and generates an error signal.

The various sensing and validation features described herein can be used collectively in a single locking switch in some embodiments. Other embodiments may comprise locking switches that incorporate only a subset of the disclosed sensing and validation features. For example, some embodiments of the disclosed locking switch 202 may include both RFID coils 506 and inductive coil 604. Other embodiments may incorporate only the RFID coils 506 without including inductive coil 604, while still other embodiments may include only the inductive coil 604 without including RFID coils 506. Moreover, while embodiments of locking switch 202 have been described herein as including three locking tongue entry slots 204, some embodiments may include more than three tongue entry slots 204 (and corresponding RFID coils 506) without departing from the scope of one or more embodiments. Some embodiments may also comprise only two tongue entry slots and corresponding RFID coils 506.

Figure 14:
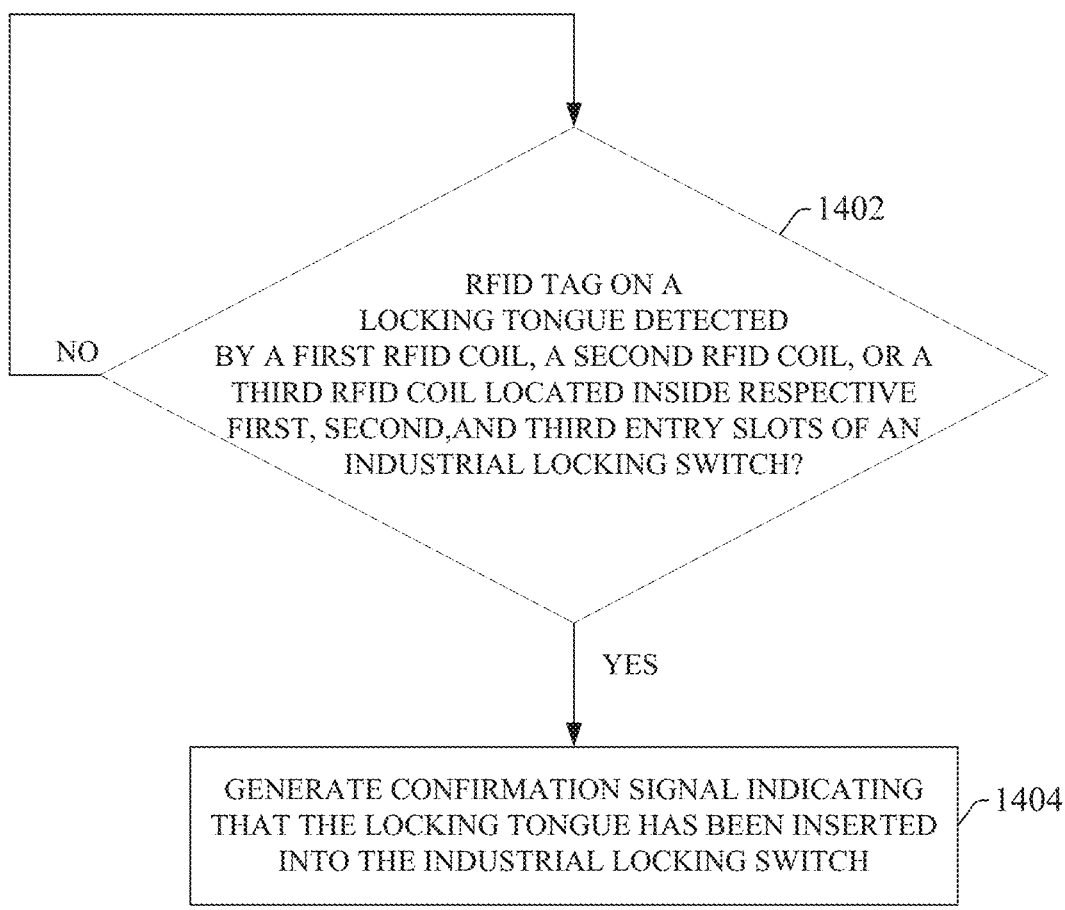
FIG. 14 is a flowchart of an example methodology for detecting insertion of a locking tongue of an actuator assembly into an industrial locking switch from any of three different directions of approach.
Figure 15:
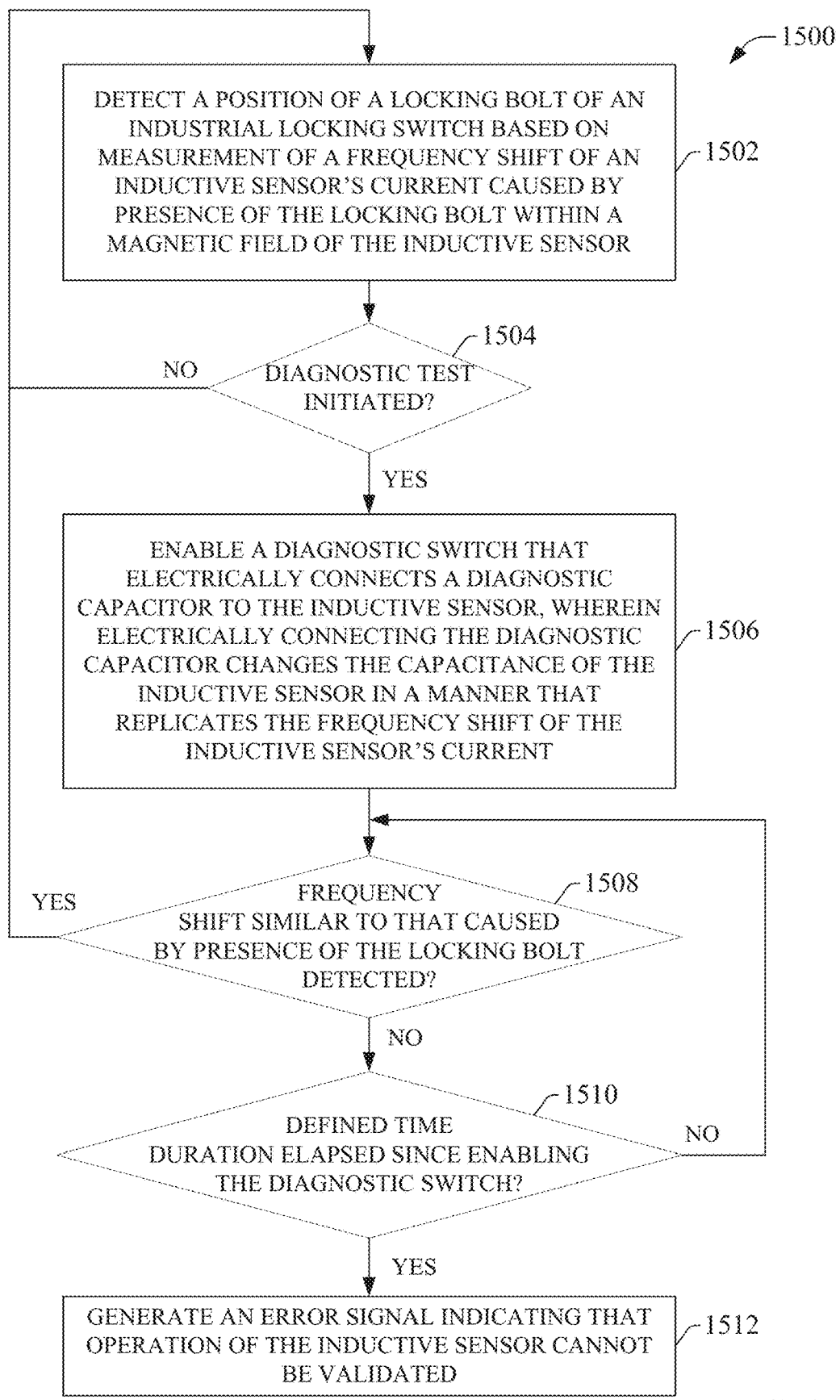
FIG. 15 is a flowchart of an example methodology for validating correct operation of an inductive sensor used to detect the position of the locking bolt of an industrial locking switch.

FIGS. 14-15 illustrate methodologies in accordance with one or more embodiments of the subject application. While, for purposes of simplicity of explanation, the methodologies shown herein are shown and described as a series of acts, it is to be understood and appreciated that the subject innovation is not limited by the order of acts, as some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the innovation. Furthermore, interaction diagram(s) may represent methodologies, or methods, in accordance with the subject disclosure when disparate entities enact disparate portions of the methodologies. Further yet, two or more of the disclosed example methods can be implemented in combination with each other, to accomplish one or more features or advantages described herein.

FIG. 14 is an example methodology 1400 for detecting insertion of a locking tongue of an actuator assembly into an industrial locking switch from any of three different directions of approach. At 1402, a determination is made as to whether an RFID tag mounted on a locking tongue of an actuator assembly is detected by any of a first RFID coil located inside a first entry slot of an industrial locking switch, a second RFID coil located inside a second entry slot of the industrial locking switch, or a third RFID coil located inside a third entry slot of the industrial locking switch. If the RFID tag is not detected by any of the three RFID coils (NO at step 1402), step 1402 repeats until any of the three RFID coils detects the RFID tag (YES at step 1402), causing the methodology to proceed to step 1404, where a confirmation signal indicating that the locking tongue has been inserted into one of the entry slots is generated. In an example implementation, the confirmation signal may be an interlock signal sent to an external or internal control system that controls the position of the locking switch's locking bolt, such that the locking bolt is engaged only if the confirmation signal is received. The first, second, and third RFID coils can be electrically connected together in series, and the determinations as to whether the RFID tag has been detected by any of the three RFID coils can be made by detection circuitry based on measured modulations induced on a current through the coils as a result of disturbances to the coils' electromagnetic fields by the RFID tag.

FIG. 15 is an example methodology 1500 for validating correct operation of an inductive sensor used to detect the position of the locking bolt of an industrial locking switch. Initially, at 1502, a position of the locking bolt is detected based on measurement of a frequency shift of the inductive sensor's current, where this frequency shift is caused by presence of the locking bolt within a magnetic field of the inductive sensor. In an example implementation, the inductive sensor may comprise an LC tank circuit having an inductive coil positioned such that the locking bolt enters the inductive coil's magnetic field when advanced to the locked position.

At 1504, a determination is made as to whether a diagnostic test of the inductive sensor is initiated. If the diagnostic test is not initiated (NO at step 1504), the methodology returns to step 1502 and the locking switch continues to operate normally, with the inductive sensor detecting when the locking bolt is in the advanced (locked) position during normal operation. If the diagnostic test is initiated (YES at step 1504), the methodology proceeds to step 1506, where a diagnostic switch is enabled that electrically connects a diagnostic capacitor to the inductive sensor. Electrically connecting the diagnostic capacitor changes the capacitance of the inductive sensor in a manner that replicates the frequency shift induced by the presence of the locking bolt during normal operation.

At 1508, a determination is made as to whether a frequency shift similar to that caused by presence of the locking bolt in its locked position is detected. If such a frequency shift is detected (YES at step 1508), operation of the inductive sensor is validated and the methodology returns to step 1502. If the frequency shift is not detected (NO at step 1508), the methodology proceeds to step 1510, where a determination is made as to whether a defined time duration has elapsed since enabling the diagnostic switch at step 1506. If the defined duration has not elapsed (NO at step 1510), the methodology returns to step 1508 and the inductive sensor continues to be monitored for the expected frequency shift. Steps 1508 and 1510 repeat until either the frequency shift is detected at step 1508 (thereby validating operation of the inductive sensor) or the defined time duration elapses at step 1510. If the expected frequency shift is not detected before the defined time duration has elapsed (YES at step 1510), the methodology proceeds to step 1512, where an error signal is generated indicating that operation of the inductive sensor cannot be validated.

Embodiments, systems, and components described herein, as well as industrial control systems and industrial automation environments in which various aspects set forth in the subject specification can be carried out, can include computer or network components such as servers, clients, programmable logic controllers (PLCs), automation controllers, communications modules, mobile computers, wireless components, control components and so forth which are capable of interacting across a network. Computers and servers include one or more processors—electronic integrated circuits that perform logic operations employing electric signals—configured to execute instructions stored in media such as random access memory (RAM), read only memory (ROM), a hard drives, as well as removable memory devices, which can include memory sticks, memory cards, flash drives, external hard drives, and so on.

Similarly, the term PLC or automation controller as used herein can include functionality that can be shared across multiple components, systems, and/or networks. As an example, one or more PLCs or automation controllers can communicate and cooperate with various network devices across the network. This can include substantially any type of control, communications module, computer, Input/Output (I/O) device, sensor, actuator, instrumentation, and human machine interface (HMI) that communicate via the network, which includes control, automation, and/or public networks. The PLC or automation controller can also communicate to and control various other devices such as standard or safety-rated I/O modules including analog, digital, programmed/ intelligent I/O modules, other programmable controllers, communications modules, sensors, actuators, output devices, and the like.

The network can include public networks such as the internet, intranets, and automation networks such as Common Industrial Protocol (CIP) networks including Device-Net, ControlNet, and Ethernet/IP. Other networks include Ethernet, DH/DH+, Remote I/O, Fieldbus, Modbus, Profibus, CAN, wireless networks, serial protocols, near field communication (NFC), Bluetooth, and so forth. In addition, the network devices can include various possibilities (hardware and/or software components). These include components such as switches with virtual local area network (VLAN) capability, LANs, WANs, proxies, gateways, routers, firewalls, virtual private network (VPN) devices, servers, clients, computers, configuration tools, monitoring tools, and/or other devices.

Figure 16:
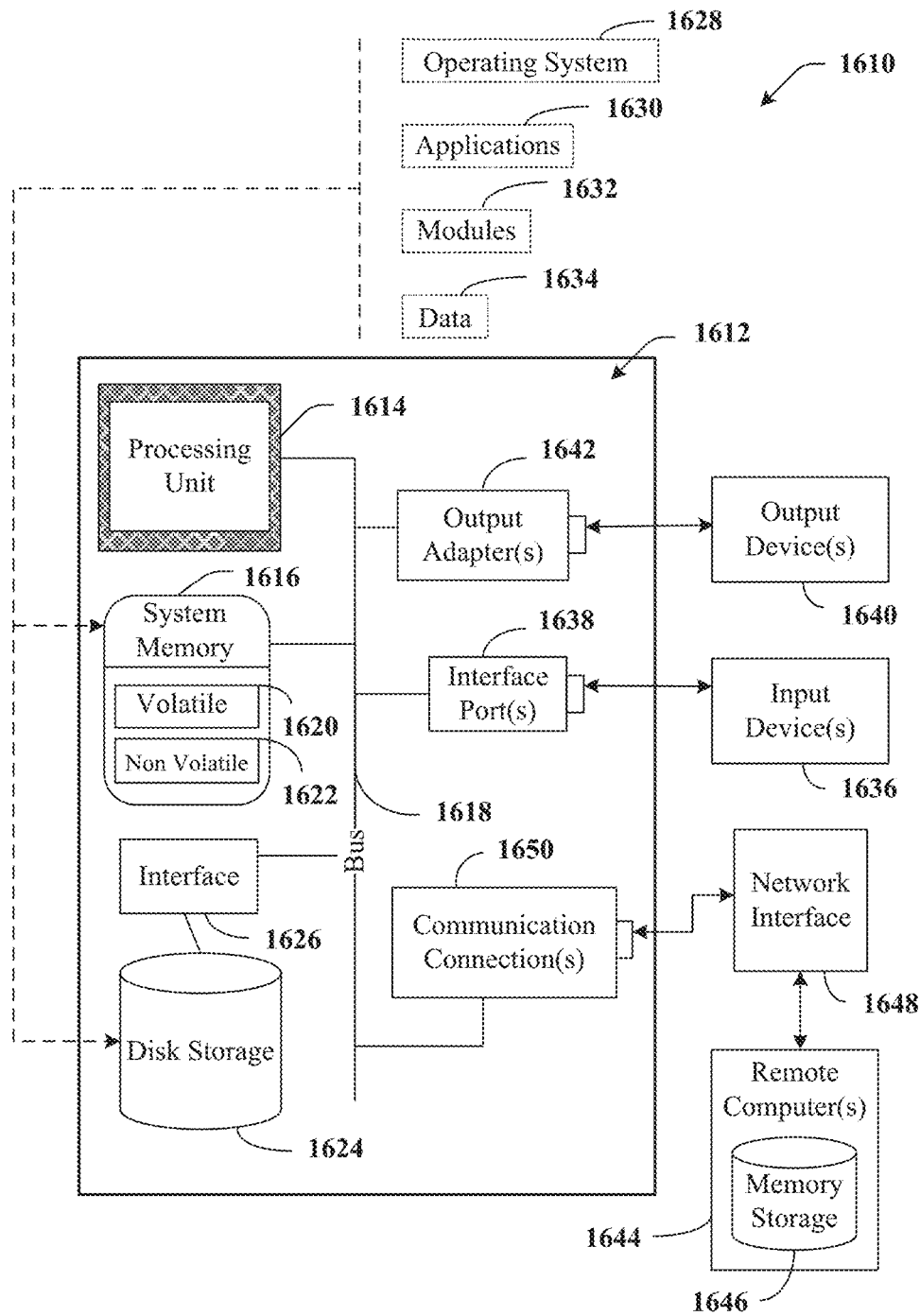
FIG. 16 is an example computing environment.
Figure 17:
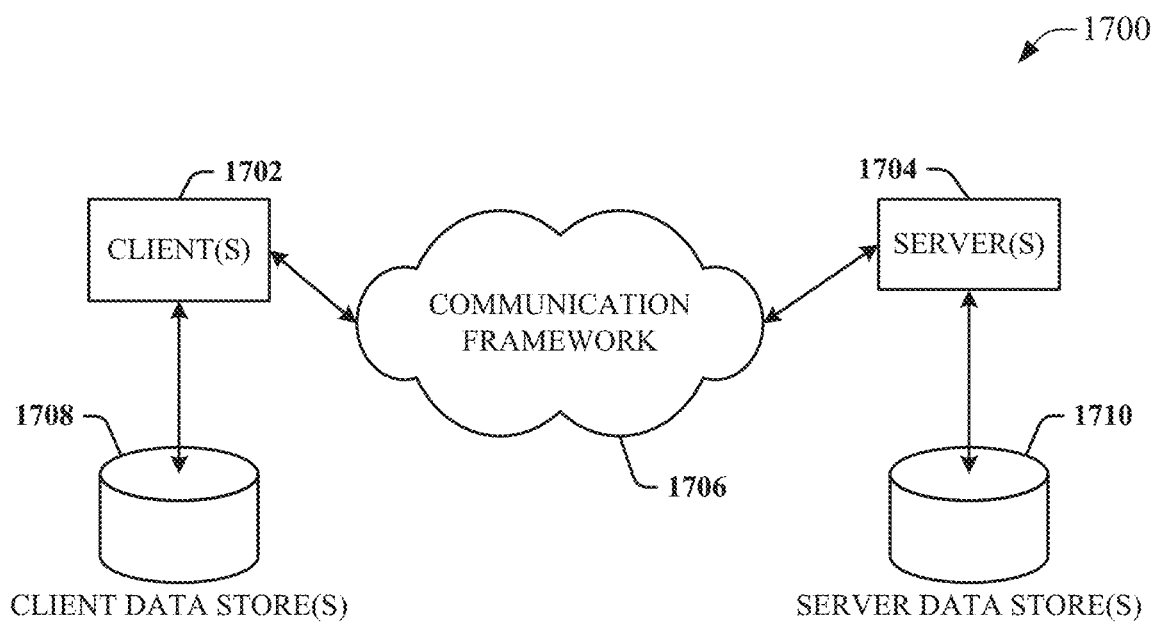
FIG. 17 is an example networking environment.

In order to provide a context for the various aspects of the disclosed subject matter, FIGS. 16 and 17 as well as the following discussion are intended to provide a brief, general description of a suitable environment in which the various aspects of the disclosed subject matter may be implemented.

With reference to FIG. 16, an example environment 1610 for implementing various aspects of the aforementioned subject matter includes a computer 1612. The computer 1612 includes a processing unit 1614, a system memory 1616, and a system bus 1618. The system bus 1618 coupled system components including, but not limited to, the system memory 1616 to the processing unit 1614. The processing unit 1614 can be any of various available processors. Multi-core microprocessors and other multiprocessor architectures also can be employed as the processing unit 1614.

The system bus 1618 can be any of several types of bus structure(s) including the memory bus or memory controller, a peripheral bus or external bus, and/or a local bus using any variety of available bus architectures including, but not limited to, 8-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI).

The system memory 1616 includes volatile memory 1620 and nonvolatile memory 1622. The basic input/output system (BIOS), containing the basic routines to transfer information between elements within the computer 1612, such as during start-up, is stored in nonvolatile memory 1622. By way of illustration, and not limitation, nonvolatile memory 1622 can include read only memory (ROM), programmable ROM (PROM), electrically programmable ROM (EPROM), electrically erasable PROM (EEPROM), or flash memory. Volatile memory 1620 includes random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM).

Computer 1612 also includes removable/non-removable, volatile/nonvolatile computer storage media. FIG. 16 illustrates, for example a disk storage 1624. Disk storage 1624 includes, but is not limited to, devices like a magnetic disk drive, floppy disk drive, tape drive, Jaz drive, Zip drive, LS-100 drive, flash memory card, or memory stick. In addition, disk storage 1624 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1624 to the system bus 1618, a removable or non-removable interface is typically used such as interface 1626.

It is to be appreciated that FIG. 16 describes software that acts as an intermediary between users and the basic computer resources described in suitable operating environment 1610. Such software includes an operating system 1628. Operating system 1628, which can be stored on disk storage 1624, acts to control and allocate resources of the computer 1612. System applications 1630 take advantage of the management of resources by operating system 1628 through program modules 1632 and program data 1634 stored either in system memory 1616 or on disk storage 1624. It is to be appreciated that one or more embodiments of the subject disclosure can be implemented with various operating systems or combinations of operating systems.

A user enters commands or information into the computer 1612 through input device(s) 1636. Input devices 1636 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1614 through the system bus 1618 via interface port(s) 1638. Interface port(s) 1638 include, for example, a serial port, a parallel port, a game port, and a universal serial bus (USB). Output device(s) 1640 use some of the same type of ports as input device(s) 1636. Thus, for example, a USB port may be used to provide input to computer 1612, and to output information from computer 1612 to an output device 1640. Output adapters 1642 are provided to illustrate that there are some output devices 1640 like monitors, speakers, and printers, among other output devices 1640, which require special adapters. The output adapters 1642 include, by way of illustration and not limitation, video and sound cards that provide a means of connection between the output device 1640 and the system bus 1618. It should be noted that other devices and/or systems of devices provide both input and output capabilities such as remote computer(s) 1644.

Computer 1612 can operate in a networked environment using logical connections to one or more remote computers, such as remote computer(s) 1644. The remote computer(s) 1644 can be a personal computer, a server, a router, a network PC, a workstation, a microprocessor based appliance, a peer device or other common network node and the like, and typically includes many or all of the elements described relative to computer 1612. For purposes of brevity, only a memory storage device 1646 is illustrated with remote computer(s) 1644. Remote computer(s) 1644 is logically connected to computer 1612 through a network interface 1648 and then physically connected via communication connection 1650. Network interface 1648 encompasses communication networks such as local-area networks (LAN) and wide-area networks (WAN). LAN technologies include Fiber Distributed Data Interface (FDDI), Copper Distributed Data Interface (CDDI), Ethernet/IEEE 802.3, Token Ring/IEEE 802.5 and the like. WAN technologies include, but are not limited to, point-to-point links, circuit switching networks like Integrated Services Digital Networks (ISDN) and variations thereon, packet switching networks, and Digital Subscriber Lines (DSL). Network interface 1648 can also encompass near field communication (NFC) or Bluetooth communication.

Communication connection(s) 1650 refers to the hardware/software employed to connect the network interface 1648 to the system bus 1618. While communication connection 1650 is shown for illustrative clarity inside computer 1612, it can also be external to computer 1612. The hardware/software necessary for connection to the network interface 1648 includes, for exemplary purposes only, internal and external technologies such as, modems including regular telephone grade modems, cable modems and DSL modems, ISDN adapters, and Ethernet cards.

FIG. 17 is a schematic block diagram of a sample computing environment 1700 with which the disclosed subject matter can interact. The sample computing environment 1700 includes one or more client(s) 1702. The client(s) 1702 can be hardware and/or software (e.g., threads, processes, computing devices). The sample computing environment 1700 also includes one or more server(s) 1704. The server(s) 1704 can also be hardware and/or software (e.g., threads, processes, computing devices). The servers 1704 can house threads to perform transformations by employing one or more embodiments as described herein, for example. One possible communication between a client 1702 and servers 1704 can be in the form of a data packet adapted to be transmitted between two or more computer processes. The sample computing environment 1700 includes a communication framework 1706 that can be employed to facilitate communications between the client(s) 1702 and the server(s) 1704. The client(s) 1702 are operably connected to one or more client data store(s) 3208 that can be employed to store information local to the client(s) 1702. Similarly, the server(s) 1704 are operably connected to one or more server data store(s) 1710 that can be employed to store information local to the servers 1704.

What has been described above includes examples of the subject innovation. It is, of course, not possible to describe every conceivable combination of components or methodologies for purposes of describing the disclosed subject matter, but one of ordinary skill in the art may recognize that many further combinations and permutations of the subject innovation are possible. Accordingly, the disclosed subject matter is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the disclosed subject matter. In this regard, it will also be recognized that the disclosed subject matter includes a system as well as a computer-readable medium having computer-executable instructions for performing the acts and/or events of the various methods of the disclosed subject matter.

In addition, while a particular feature of the disclosed subject matter may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

In this application, the word "exemplary" is used to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks [e.g., compact disk (CD), digital versatile disk (DVD) . . . ], smart cards, and flash memory devices (e.g., card, stick, key drive . . . ).

What is claimed is:

1. A locking switch, comprising:
one or more entry slots configured to receive a locking tongue;
a radio frequency identifier (RFID) tag attached to the locking tongue; and
a detection circuitry comprising one or more RFID coils, wherein each of the one or more RFID coils is attached to one of the one or more entry slots, wherein the detection circuitry is configured to:
generate a current signal through the one or more RFID coils; measure one or more modulations of the current signal; detect insertion of the locking tongue into one of the one or more entry slots based on the measurement; and generate a detection signal in response to the detection of insertion of the locking tongue into one of the one or more entry slots;

further comprising a locking bolt configured to engage with the locking tongue when advanced to a locking position; and a control circuitry configured to receive the detection signal and determine a position of locking bolt based at least in part on the detection signal.

2. The locking switch of claim 1, wherein the one or more entry slots comprises: a first entry slot located on a first side of the locking switch, a second entry slot located on a second side of the locking switch, and a third entry slot located on a third side of the locking switch.

3. The locking switch of claim 2, wherein the locking tongue is configured to insert in one of the first, the second, or the third entry slots.

4. The locking switch of claim 3, wherein the one or more RFID coils comprises: a first RFID coil attached to the first entry slot, a second RFID coil attached to the second entry slot, a third RFID coil attached to the third entry slot.

5. The locking switch of claim 4, wherein the first, the second, and the third RFID coils are electrically connected in series.

6. The locking switch of claim 1, wherein the one or more RFID coils are mounted on a top surface of a bobbin mounted inside a housing of the locking switch, wherein the top surface of the bobbin is slanted relative to a bottom surface of the bobbin, wherein the top surface tilts the one or more RFID coils outward from a center of the bobbin.

7. A system for sensing a position of a locking bolt of an industrial locking switch, comprising:

an inductive circuit comprising an inductive coil and a capacitor electrically connected in parallel, wherein the inductive coil is positioned to receive a locking bolt of an industrial locking switch when the locking bolt is transitioned to a lock position;

a converter configured to convert a frequency of a current signal on the inductive circuit to a digital frequency value; and a master controller configured to generate a bolt detection signal in response to determining that the digital frequency value changes by an amount equal to or substantially equal to a defined frequency shift corresponding to a frequency shift induced by the inductive coil in response to presence of the locking bolt within the inductive coil's magnetic field;

wherein the inductive coil is mounted in a central opening of a bobbin mounted inside a housing of the locking switch; and an RFID coil is mounted on a top surface of the bobbin that is slanted relative to a bottom surface of the bobbin, and the top surface tilts the at least one RFID coil relative to the inductive coil.

8. The system of claim 7, wherein the bobbin is oriented to cause the locking bolt to pass through the central opening and the inductive coil when the locking bolt is transitioned to the lock position.

9. The system of claim 8, wherein a first operating frequency of the inductive coil is different than a second operating frequency of the radio frequency identifier (RFID) coil mounted on the bobbin and configured to detect insertion of a locking tongue into the locking switch.

10. The locking switch of claim 9, wherein the locking bolt comprises a first metal and the locking tongue comprises a second metal, and the first metal causes the inductive coil to induce a greater frequency shift of the current signal than the second metal.

11. A method for detecting positions of a locking tongue of a locking switch, comprising:

one or more entry slots configured to receive a locking tongue;

a radio frequency identifier (RFID) tag attached to the locking tongue;

generating a current signal through an inductive sensing circuit attached to one of the one or more entry slots, in response to detecting that a locking tongue is advanced to a locking position, wherein the inductive sensing circuit comprises an inductive coil and a capacitor;

converting a frequency of the current signal to a digital frequency value;

determining whether a shift in the digital frequency value corresponds to an expected frequency shift of the current signal induced by the inductive coil in response to advancement of the locking tongue; and generating a lock detection signal in response to determining that the shift in the digital frequency value corresponds to the expected frequency shift of the current signal;

further comprising a locking bolt configured to engage with the locking tongue when advanced to a locking position; and a control circuitry configured to receive the detection signal and determine a position of locking bolt based at least in part on the detection signal.

12. The method of claim 11, further comprising:

generating a current signal through one or more radio frequency identifier (RFID) coils attached to one or more entry slots of the lock switch;

measuring one or more modulations of the current signal through the one or more RFID coils;

detecting insertion of the locking tongue into one of the one or more entry slots based on the measurement; and generate a detection signal indicating that the lock tongue is advanced to the locking position in response to the detection of insertion of the locking tongue into one of the one or more entry slots.

13. The method of claim 11, further comprising connecting a diagnostic capacitor in parallel with the capacitor of the inductive sensing circuit.

14. The method of claim 13, wherein the connecting comprises enabling a diagnostic switch that electrically connects the diagnostic capacitor to the inductive sensing circuit.

15. The method of claim 13, wherein the diagnostic capacitor has a capacitance that, in response to connection of the diagnostic capacitor to the inductive circuit in parallel with the capacitor, causes the frequency of the current signal to shift by the defined frequency shift.

16. The method of claim 13, further comprising in response to determining that the frequency of the current signal through the inductive sensing circuit does not change, within a defined duration after the connecting of the diagnostic capacitor, by an amount equal to or substantially equal to a frequency shift caused by presence of the locking bolt in the inductive coil's magnetic field, generating an error message indicating that the inductive sensing circuit is not operating correctly.

17. The method of claim 16, wherein the generating the error signal comprises sending the error signal to at least one of an industrial safety system or an industrial control system.

* * * * *